(12) United States Patent
Kim et al.

(10) Patent No.: US 7,807,999 B2
(45) Date of Patent: Oct. 5, 2010

(54) ARRAY SUBSTRATE, LIQUID CRYSTAL DISPLAY APPARATUS HAVING THE SAME AND METHOD FOR DRIVING LIQUID CRYSTAL DISPLAY APPARATUS

(75) Inventors: Hee-Seop Kim, Hwaseong-gun (KR); Won-Sang Park, Yongin-si (KR); Sang-Il Kim, Suwon-si (KR); Dong-Sik Sakong, Seongnam-si (KR); Young-Chol Yang, Gunpo-si (KR); Sung-Kyu Hong, Seongnam-si (KR); Jong-Lae Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1243 days.

(21) Appl. No.: 10/539,678

(22) PCT Filed: Dec. 17, 2003

(86) PCT No.: PCT/KR03/02755

§ 371 (c)(1),
(2), (4) Date: Jun. 16, 2005

(87) PCT Pub. No.: WO2004/057411

PCT Pub. Date: Jul. 8, 2004

(65) Prior Publication Data

US 2006/0060849 A1    Mar. 23, 2006

(30) Foreign Application Priority Data

Dec. 21, 2002  (KR) ...................... 10-2002-0082048
Dec. 21, 2002  (KR) ...................... 10-2002-0082049
Mar. 25, 2003  (KR) ...................... 10-2003-0018508

(51) Int. Cl.
     *H01L 29/04*  (2006.01)

(52) U.S. Cl. .......... 257/59; 257/223; 257/227; 257/E29.202; 257/E27.132; 257/E31.097; 257/E27.1; 257/E27.112; 257/E29.117; 257/E29.151; 257/E23.016; 257/291; 257/439; 257/443; 257/655

(58) Field of Classification Search ............... 257/72, 257/223, 227, 291, E29.202, E27.132, E31.097, 257/E27.1, 439, 443, E29.117, E29.151, 257/E23.016, 59
See application file for complete search history.

(56) References Cited

U.S. PATENT DOCUMENTS 4,678,282 A    7/1987  Yaniv et al.

(Continued)

*Primary Examiner*—Wael M Fahmy
*Assistant Examiner*—Marc Armand
(74) *Attorney, Agent, or Firm*—F. Chau & Associates, LLC

(57) ABSTRACT

An array substrate includes a gate line, a data line, a switching device, a transmissive electrode, a reflective electrode and a compensating wiring. A pixel region includes first and second regions. The switching device is connected to the gate line and the data line. The transmissive electrode is connected to the switching device. The transmissive electrode is formed in the first region. The reflective electrode is insulated from the transmissive electrode. The reflective electrode is formed in the second region that is adjacent to the first region. The compensating wiring is connected to the switching device. The compensating wiring faces the reflective electrode in the second region with an insulation layer interposed therebetween. Thus, both of a reflectivity of the reflective electrode and a transmissivity of the transmissive electrode are enhanced simultaneously, while the liquid crystal display apparatus maintains a uniform cell gap.

7 Claims, 23 Drawing Sheets

U.S. PATENT DOCUMENTS

| | | | | |
|---|---|---|---|---|
| 6,040,882 | A * | 3/2000 | Jun et al. | 349/39 |
| 6,195,140 | B1 | 2/2001 | Kubo et al. | |
| 6,417,896 | B1 * | 7/2002 | Yamazaki et al. | 349/39 |
| 6,549,258 | B1 * | 4/2003 | Shin et al. | 349/141 |
| 2001/0026343 | A1 | 10/2001 | Kubo et al. | |
| 2002/0008898 | A1 * | 1/2002 | Katase | 359/296 |
| 2002/0105614 | A1 | 8/2002 | Nakayama et al. | |
| 2002/0176030 | A1 * | 11/2002 | Matsumoto | 349/43 |
| 2003/0020853 | A1 * | 1/2003 | Park et al. | 349/113 |
| 2003/0095223 | A1 * | 5/2003 | Song | 349/141 |
| 2003/0164500 | A1 * | 9/2003 | Tsunoda et al. | 257/72 |

* cited by examiner

ARRAY SUBSTRATE, LIQUID CRYSTAL DISPLAY APPARATUS HAVING THE SAME AND METHOD FOR DRIVING LIQUID CRYSTAL DISPLAY APPARATUS

TECHNICAL FIELD

The present invention relates to an array substrate, a liquid crystal display apparatus having the array substrate and a method for driving the liquid crystal display apparatus, and more particularly to an array substrate for enhancing light using efficiency and productivity, a liquid crystal display apparatus having the array substrate and a method for driving the liquid crystal display apparatus.

BACKGROUND ART

The liquid crystal display apparatus includes a reflective type liquid crystal display apparatus and a transmissive type liquid crystal display apparatus. The reflective type liquid crystal display apparatus uses an external light (hereinafter, referred to as first light) so as to display an image. The transmissive type liquid crystal display apparatus includes a light source for generating an internal light (hereinafter, referred to as second light) so as to display an image. Recently, a transmissive and reflective type liquid crystal display apparatus has been developed. The transmissive and reflective type liquid crystal display apparatus has merits of both of the transmissive type and reflective type, such as high quality of image, low power consumption, etc.

The transmissive and reflective type liquid crystal display apparatus uses the first light (or external light) when the external light is sufficient, and uses the second light generated from the light source when the external light is not sufficient.

The transmissive and reflective type liquid crystal display apparatus includes an array substrate, a color filter substrate and a liquid crystal layer. The color filter substrate faces the array substrate. The liquid crystal display apparatus is interposed between the color filter substrate and the array substrate.

The array substrate of a liquid crystal display apparatus includes a plurality of unit pixels arranged in a matrix shape. Each of the unit pixels includes data line, gate line and a thin film transistor. The gate line is substantially perpendicular to the data line. The thin film transistor is disposed in a region defined by the data line and the gate line. The thin film transistor is electrically connected to the data line and the gate line. A transmissive electrode and a reflective electrode are electrically connected to the thin film transistor. The transmissive electrode is transparent and electrically conductive. The reflective electrode has a high reflectance. Regions on the transmissive electrode include a reflection region and a transmission region. The reflective electrode is only formed in the reflection region.

An insulation layer is interposed between the thin film transistor and the transmissive electrode so as to electrically connect the transmissive electrode only to a drain electrode of the thin film transistor. In detail, the insulation layer includes a contact hole. The transmissive electrode and the drain electrode are electrically connected to each other via the contact hole.

Thus, when a data voltage and a driving voltage are applied to the data line and the gate line respectively, the thin film transistor operates in response to the data voltage and the driving voltage, so that the data voltage and the driving voltage are applied to the transmissive electrode and the reflective electrode via the thin film transistor.

Generally, in the transmissive and reflective type liquid crystal display apparatus, a cell gap of the reflection region is different from a cell gap of the transmission region. That is, the cell gap of the reflection region is a half of the cell gap of the transmission region so as to enhance a display quality.

A thickness of the insulation layer is modulated so as to form the different cell gaps according to a region.

However, modulating the cell gap is difficult, so uniformity of the cell gap is deteriorated and a productivity of a liquid crystal display apparatus is lowered.

DISCLOSURE OF THE INVENTION

The present invention provides an array substrate for enhancing display quality and productivity.

The present invention also provides a liquid crystal display apparatus having the array substrate.

The present invention also provides a method of driving the liquid crystal display apparatus.

According to one aspect of the array substrate, the array substrate includes a gate line, a data line, a switching device, a transmissive electrode, a reflective electrode and a compensating wiring. The data line crosses the gate line to define a pixel region that includes first and second regions. The switching device is electrically connected to the gate line and the data line. The transmissive electrode is electrically connected to the switching device. The transmissive electrode is formed in the first region. The reflective electrode is electrically insulated from the transmissive electrode. The reflective electrode is formed in the second region that is adjacent to the first region. The compensating wiring is electrically connected to the switching device. The compensating wiring faces the reflective electrode in the second region with an insulation layer interposed between the compensating wiring and the reflective electrode.

According to another aspect of the array substrate, the array substrate includes a first gate line, a second gate line, a data line, a first switching device, a second switching device, a transmissive electrode, a reflective electrode and a compensating wiring. The second gate line is electrically insulated from the first gate line. The data line crosses the first and second gate lines to define a pixel region that includes first and second regions. The first switching device is electrically connected to the first gate line and the data line. The second switching device is electrically connected to the second gate line. The transmissive electrode formed in the first region is electrically connected to the second switching device. The reflective electrode is electrically insulated from the transmissive electrode. The reflective electrode is formed in the second region that is adjacent to the first region. The compensating wiring is electrically connected to the first switching device. The compensating wiring faces the reflective electrode and the transmissive electrode with an insulation layer interposed therebetween.

According to one aspect of the liquid crystal display apparatus, the liquid crystal display apparatus includes first and second substrates, and a liquid crystal layer interposed between the first and second substrates. The first substrate includes a gate line, a data line, a switching device, a transmissive electrode, a reflective electrode and a compensating wiring. The data line crosses the gate line to define a pixel region that includes first and second regions. The switching device is electrically connected to the gate line and the data line. The transmissive electrode formed in the first region is electrically connected to the switching device. The reflective electrode is electrically insulated from the transmissive electrode. The reflective electrode is formed in the second region that is adjacent to the first region. The compensating wiring is electrically connected to the switching device. The compensating wiring faces the reflective electrode in the second region while an insulation layer is interposed between the compensating wiring and the reflective electrode. The second substrate includes a common electrode that faces the transmissive electrode and the reflective electrode. The liquid crystal layer is interposed between the first and second substrates.

According to another aspect of the liquid crystal display apparatus, the liquid crystal display apparatus includes first and second substrates, and liquid crystal layer. The first substrate includes a first gate line, a second gate line, a data line, a first switching device, a second switching device, a transmissive electrode, a reflective electrode and a compensating wiring. The second gate line is electrically insulated from the first gate line. The data line crosses the first and second gate lines to define a pixel region that includes first and second regions. The first switching device is electrically connected to the first gate line and the data line. The second switching device is electrically connected to the second gate line. The transmissive electrode formed in the first region is electrically connected to the second switching device. The reflective electrode is electrically insulated from the transmissive electrode. The reflective electrode is formed in the second region that is adjacent to the first region. The compensating wiring is electrically connected to the first switching device. The compensating wiring faces the reflective electrode and the transmissive electrode while an insulation layer is interposed between the compensating wiring and the reflective electrode and between the compensating wiring and the transmissive electrode. The second substrate includes a common electrode that faces the transmissive electrode and the reflective electrode. The liquid crystal layer is interposed between the first and second substrates.

According to another aspect of the liquid crystal display apparatus, the liquid crystal display apparatus includes first and second substrate, and a liquid crystal layer. The first substrate includes first and second switching devices, a transmissive electrode and a reflective electrode. The first switching device is electrically connected to a data line and a gate line. The second switching device is electrically connected to the first switching device. The transmissive electrode and the reflective electrode are electrically connected to the first and second switching devices respectively or reverse. The second substrate includes a common electrode that faces the first and second electrodes. The liquid crystal layer is interposed between the first and second substrates.

According to another aspect of the liquid crystal display apparatus, the liquid crystal display apparatus includes first and second substrates, and a liquid crystal layer. The first substrate includes a switching device that is electrically connected to a data line and a gate line, a transmissive electrode that is electrically connected to the switching device, a reflective electrode that is electrically connected to the switching device, and a metal wiring facing the reflective electrode with an insulation layer interposed between the metal wiring and the reflective electrode. The second substrate includes a common electrode facing the transmissive electrode and the reflective electrode. The liquid crystal layer is interposed between the first and second substrates.

According to another aspect of the liquid crystal display apparatus, the liquid crystal display apparatus includes first and second substrates, and a liquid crystal layer. The first substrate includes a pixel region having a switching device and a plurality of pixel electrodes electrically connected to the switching device. The second substrate includes a plurality of common electrodes. Each of the common electrodes corresponds to each of the pixel electrodes. The liquid crystal layer is interposed between the first and second substrates.

According to one aspect of the method of driving the liquid crystal display apparatus, a gate voltage is applied to a gate line. A data voltage provided from a data line is outputted in response to the gate voltage. The data voltage is applied to a transmissive electrode as a transmissive voltage. A reflective voltage generated from the data voltage is applied to a reflective electrode. The reflective voltage is lower than the data voltage. Then, a reference voltage is applied to a common electrode that faces the reflective electrode and the transmissive electrode.

According to another aspect of the method of driving the liquid crystal display apparatus, A first gate voltage is applied to a first gate line. A first data voltage that is provided from a data line is outputted in response to the first gate voltage. A transmissive voltage generated from the first data voltage is applied to a transmissive electrode. The transmissive voltage is higher than the first data voltage. A reflective voltage generated from the first data voltage is applied to a reflective electrode. The reflective voltage is lower than the first data voltage. Then, a reference voltage is applied to a common electrode that faces the reflective electrode and the transmissive electrode.

Thus, both of a reflectivity of the reflective electrode and a transmissivity of the transmissive electrode are enhanced simultaneously while the liquid crystal display apparatus maintains a uniform cell gap.

BRIEF DESCRIPTION OF THE DRAWINGS

The above and other advantages of the present invention will become readily apparent by reference to the following detailed description when considered in conjunction with the accompanying drawings wherein.

BEST MODE FOR CARRYING OUT THE INVENTION

Hereinafter the preferred embodiment of the present invention will be described in detail with reference to the accompanying drawings.

Embodiment 1

Figure 1:
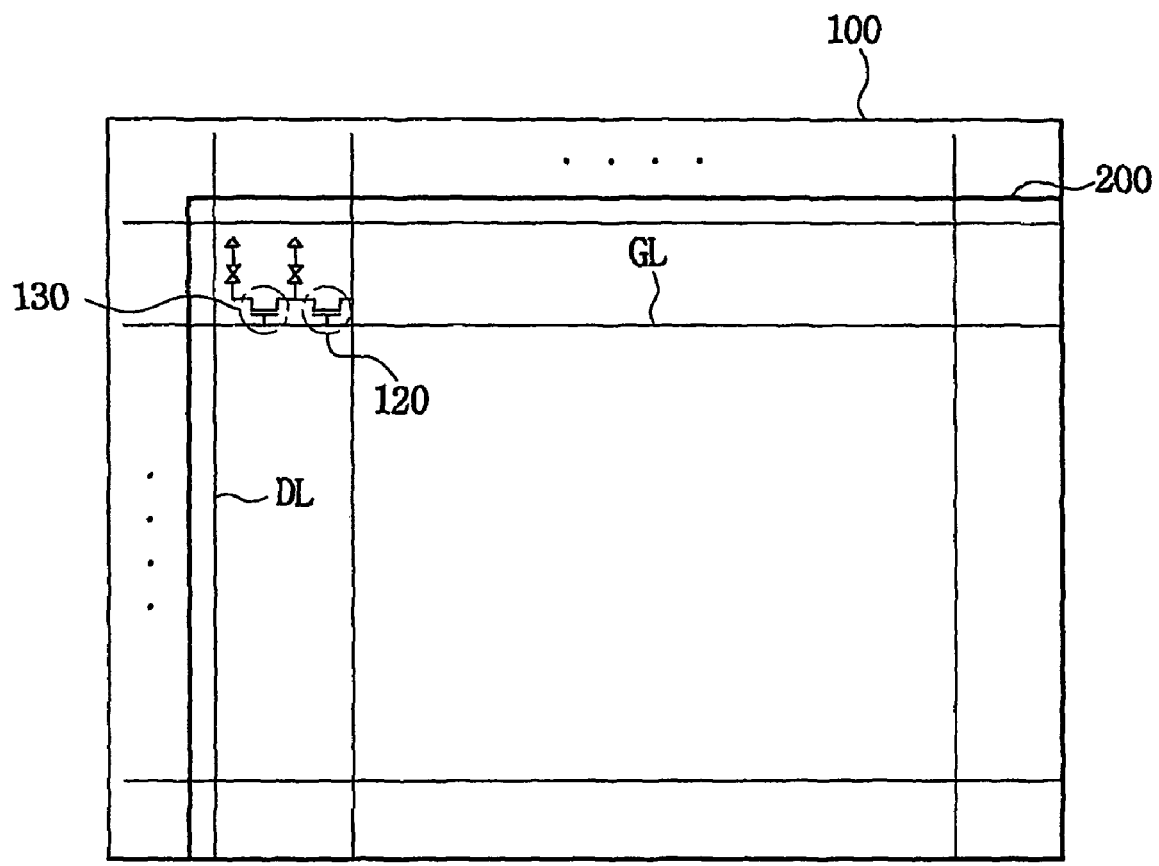
FIG. 1 is a schematic view showing a liquid crystal display apparatus according to a first exemplary embodiment of the present invention.
Figure 2:
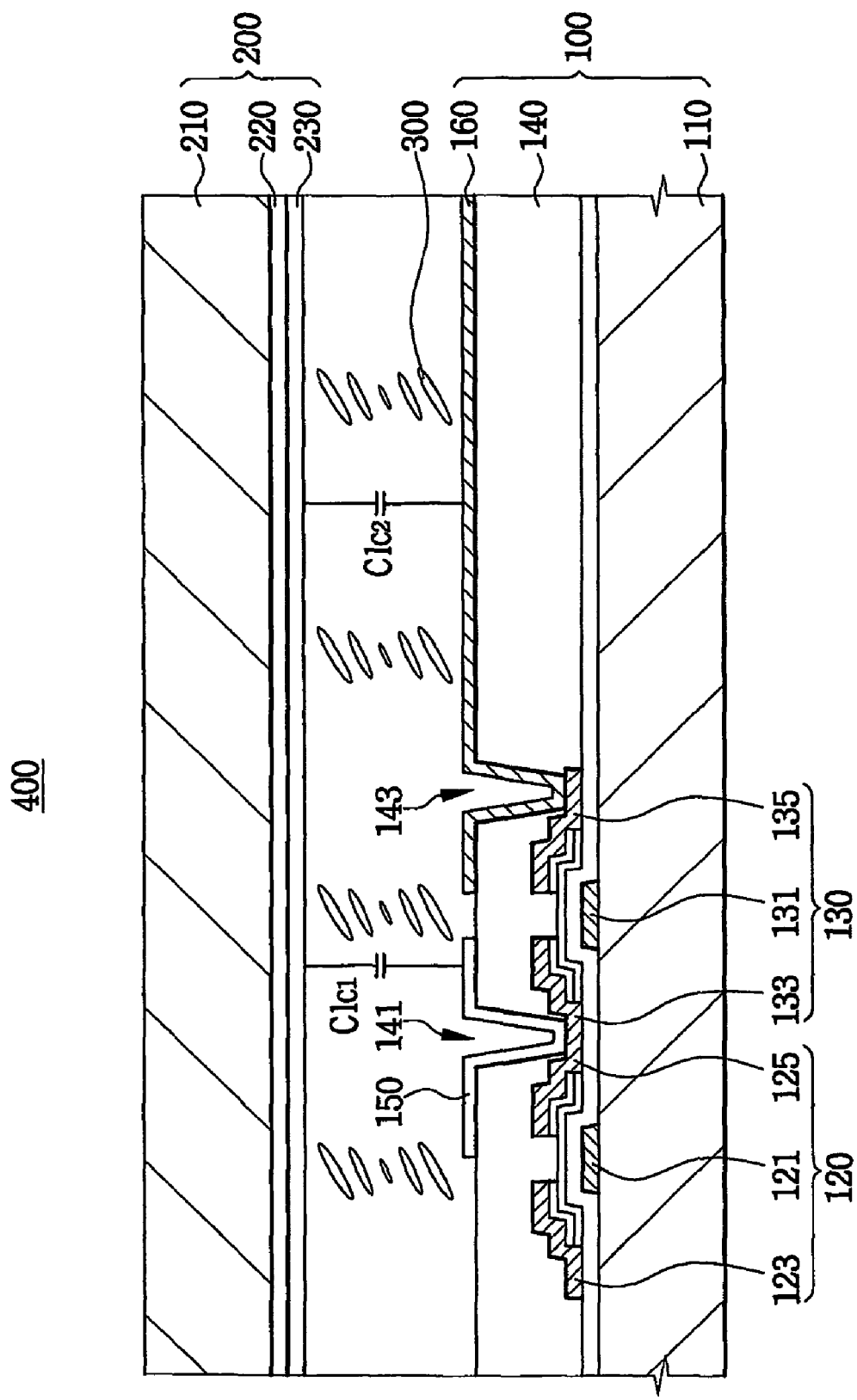
FIG. 2 is a cross-sectional view showing the liquid crystal display apparatus of FIG. 1.

FIG. 1 is a schematic view showing a liquid crystal display apparatus according to a first exemplary embodiment of the present invention, and FIG. 2 is a cross-sectional view showing the liquid crystal display apparatus of FIG. 1.

Referring to FIGS. 1 and 2, a liquid crystal display apparatus 400 according to a first exemplary embodiment of the present invention includes an array substrate 100, a color filter substrate 200 and a liquid crystal layer 300. The color filter substrate 200 faces the array substrate 100. The liquid crystal layer 300 is interposed between the array substrate 100 and the color filter substrate 200.

The array substrate 100 includes a plurality of pixels. The pixels are formed on a first substrate 110 such that the pixels are arranged in a matrix shape. Each of the pixels includes a data line DL and a gate line GL. The data line DL extends in a first direction, and the gate line GL extends in a second direction that is substantially perpendicular to the first direction. The array substrate 100 further includes a first thin film transistor 120 and a second thin film transistor 130. The first thin film transistor 120 is disposed in a region defined by the data line DL and the gate line GL. The first thin film transistor 120 is electrically connected to the data line DL and the gate line GL. The second thin film transistor 130 is electrically connected to the first thin film transistor 120 and the gate line GL. The first thin film transistor 120 is electrically connected to a transmissive electrode 150 comprising a material that is transparent and electrically conductive. The second thin film transistor 130 is electrically connected to a reflective electrode 160 that has high reflectance.

In detail, the first thin film transistor 120 includes a first source electrode 123, a first gate electrode 121 and a first drain electrode 125. The first source electrode 123 is electrically connected to the data line DL. The first gate electrode 121 is electrically connected to the gate line GL. The first drain electrode is electrically connected to the transmissive electrode 150. The second thin film transistor 130 includes a second source electrode 133, a second gate electrode 131 and a second drain electrode 135. The second source electrode 133 is electrically connected to the first drain electrode 125. The second gate electrode 131 is electrically connected to the gate line GL. The second drain electrode 135 is electrically connected to the reflective electrode 160.

An insulation layer 140 is interposed between the first thin film transistor 120 and the transmissive electrode 150. The insulation layer 140 is interposed also between the second thin film transistor 130 and the reflective electrode 160.

The transmissive electrode 150 is electrically connected to the first drain electrode 125, and the reflective electrode 160 is electrically connected to the second drain electrode 135 due to the insulation layer 140. In detail, the insulation layer 140 includes first and second contact holes 141 and 143. The first and second drain electrodes 125 and 135 are exposed via the first and second contact holes 141 and 143 respectively. Thus, the transmissive electrode 150 is electrically connected to the first drain electrode 125 via the first contact hole 141, and the reflective electrode 160 is electrically connected to the second drain electrode 135 via the second contact hole 143.

The transmissive electrode 150 and the reflective electrode 160 are electrically connected to each other via the second thin film transistor 130.

A region where the transmissive electrode 150 is formed corresponds to a transmissive region and a region where the reflective electrode 160 is formed corresponds to a reflection region.

The color filter substrate 200 includes a color filter layer 220 and a common electrode 230. The color filter layer 220 includes a red-color filter, a green-color filter and a blue color filter. The color filter layer 220 is formed on a second substrate 210. The common electrode 230 is formed on the color filter layer 220. The common electrode 230 comprises a material that is transparent and electrically conductive. The liquid crystal layer 300 is interposed between the array substrate 100 and the color filter substrate 200.

Thus, the first thin film transistor 120 is electrically connected to a first liquid crystal capacitor Clc1 defined by the transmissive electrode 150, the liquid crystal layer 300 and the common electrode 230. The second thin film transistor 130 is electrically connected to a second liquid crystal capacitor Clc2 defined by the reflective electrode 160, the liquid crystal layer 300 and the common electrode 230.

Figure 3:
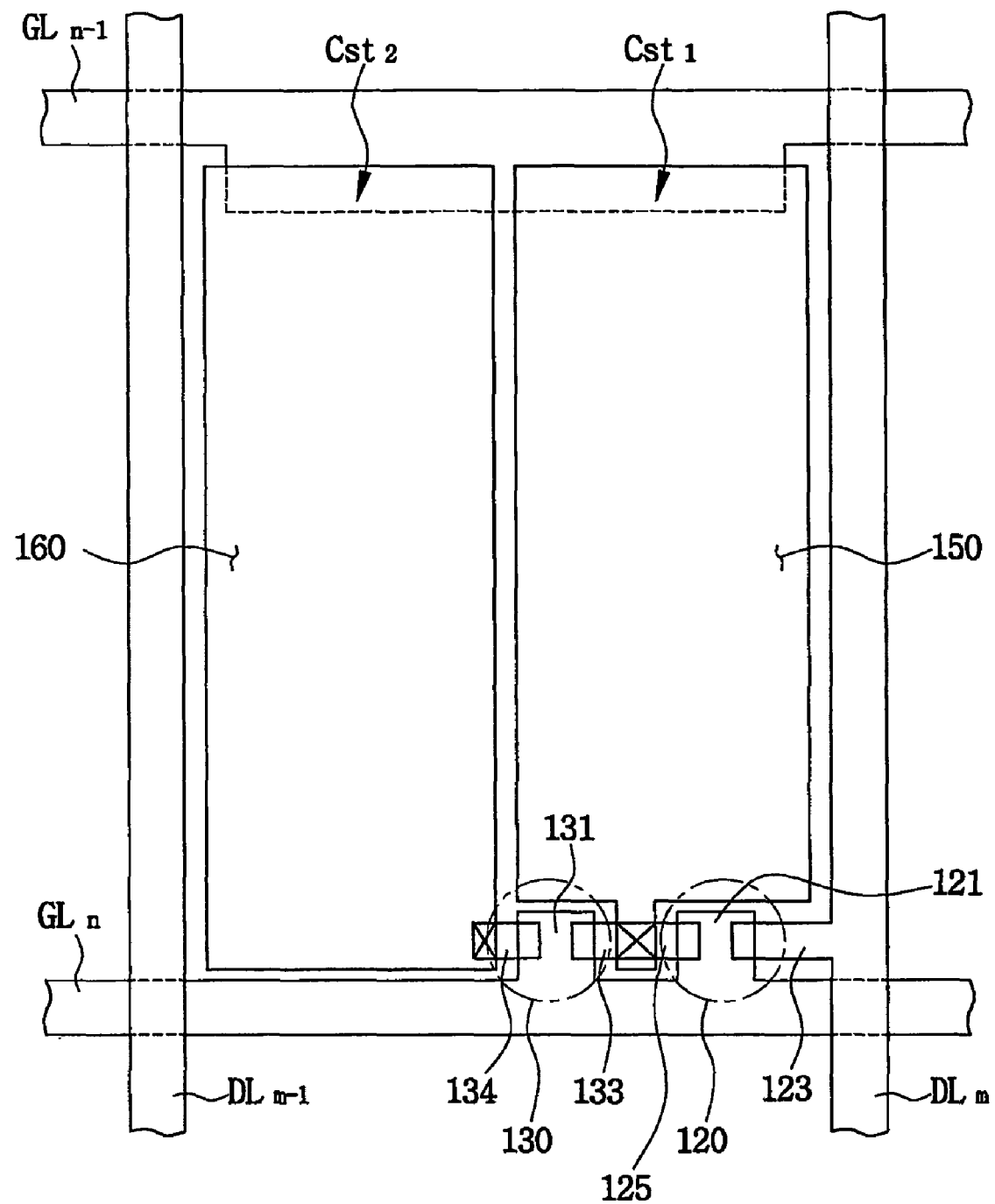
FIG. 3 is a layout showing a unit pixel of the liquid crystal display apparatus of FIG. 1.
Figure 4:
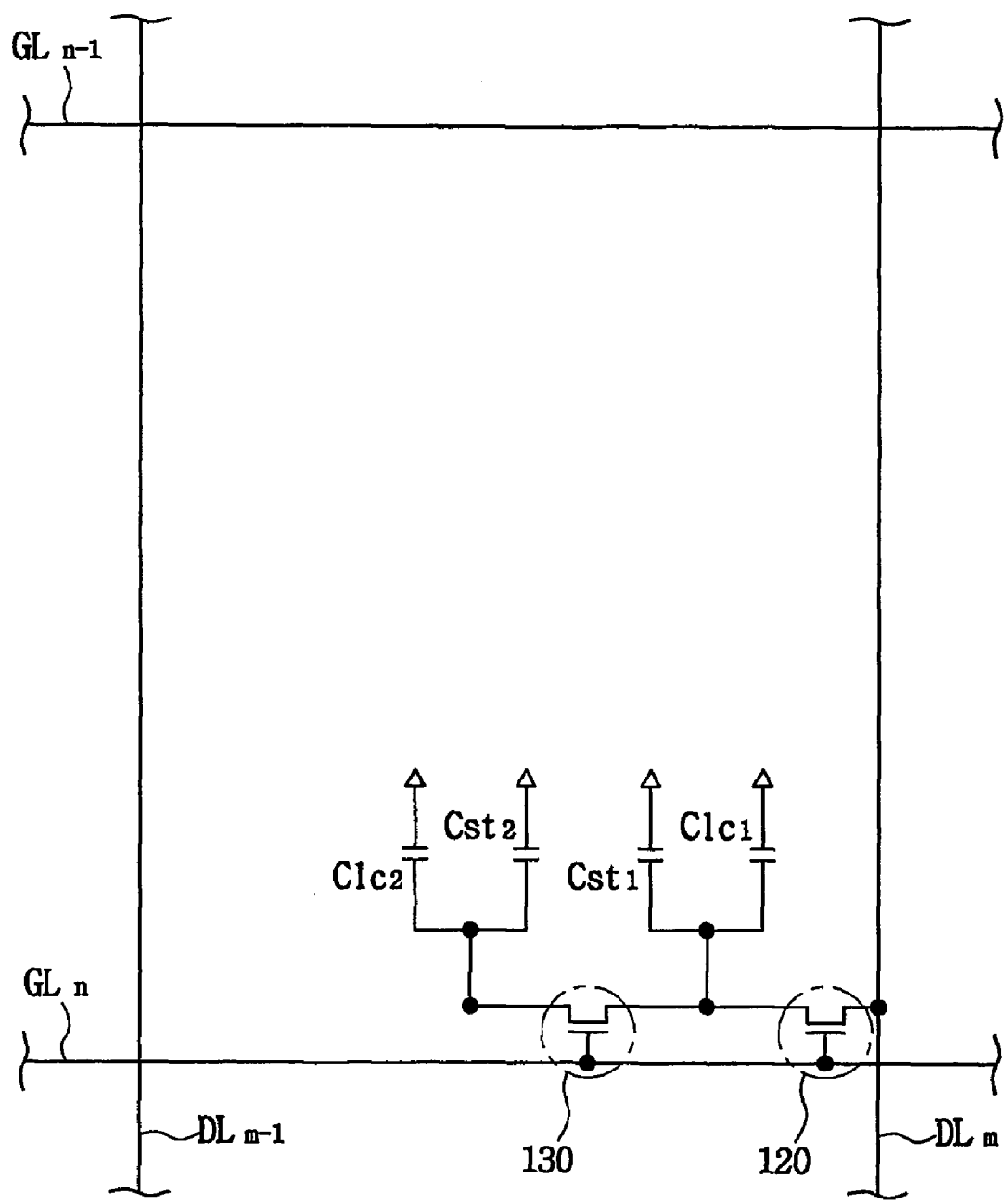
FIG. 4 is an equivalent circuit diagram of the unit pixel of FIG. 3.

FIG. 3 is a layout showing a unit pixel of the liquid crystal display apparatus of FIG. 1, and FIG. 4 is an equivalent circuit diagram of the unit pixel of FIG. 3.

Referring to FIGS. 3 and 4, a unit pixel includes m-th data line DLm extending in a first direction, and an n-th gate line GLn extending in a second direction that is substantially perpendicular to the first direction. A first thin film transistor 120 is formed in a region defined by (m−1)-th and m-th data lines DLm−1 and DLm, and (n−1)-th and n-th gate lines GLn−1 and GLn.

The first thin film transistor 120 includes a first source electrode 123 that is electrically connected to the m-th data line DLm, a first gate electrode 121 that is electrically connected to the n-th gate line GLn, and a first drain electrode 125 that is electrically connected to a transmissive electrode 150. The transmissive electrode 150 faces a common electrode (not shown) of a color filter substrate with a liquid crystal layer interposed between the transmissive electrode 150 and the common electrode, so that a first liquid crystal capacitor Clc1 is formed. The transmissive electrode 150 also overlaps the (n−1)-th gate line GLn−1 with an insulation layer (not shown) interposed between the transmissive electrode 150 and the (n−1)-th gate line GLn-1, so that a first storage capacitor Cst1 that is electrically connected to the first liquid crystal capacitor Clc1 in parallel is formed.

A second thin film transistor 130 is also formed in the region defined by (m−1)-th and m-th data line DLm-1 and DLm, and (n−1)-th and n-th gate line GLn-1 and GLn.

The second thin film transistor 130 includes a second source electrode 133 that is electrically connected to the first drain electrode 125, a second gate electrode 131 that is electrically connected to the n-th gate line GLn, and a second drain electrode 135 that is electrically connected to a reflective electrode 160. The reflective electrode 160 faces the common electrode while the liquid crystal layer is interposed between the reflective electrode 160 and the common electrode, so that a second liquid crystal capacitor Clc2 is formed. The reflective electrode 160 also overlaps the (n−1)-th gate line GLn-1 with the insulation layer (not shown) interposed between the reflective electrode 160 and the (n−1)-th gate line GLn-1, so that a second storage capacitor Cst2 that is electrically connected to the second liquid crystal capacitor Clc2 in parallel is formed.

Figure 5:
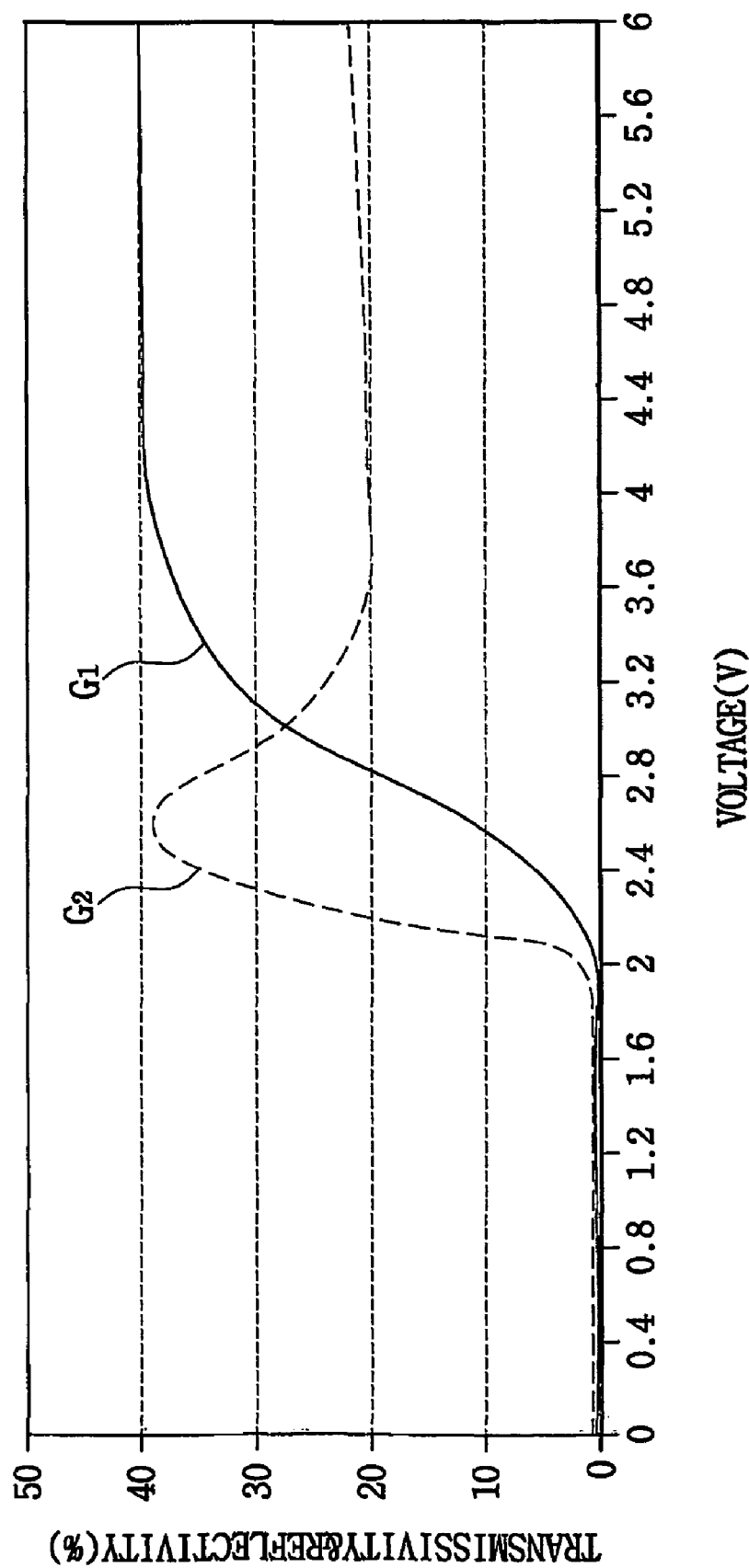
FIG. 5 is a graph showing transmissivity and reflectivity according to a voltage applied to a transmissive electrode and a reflective electrode.

FIG. 5 is a graph showing a transmissivity and a reflectivity according to a voltage applied to transmissive and reflective electrode. X-axis of the graph corresponds to transmissivity and reflectivity (%), and Y-axis corresponds to a voltage that is applied to a transmissive electrode and a reflective electrode. A solid line G1 corresponds to the transmissivity, and a dotted line G2 corresponds to the reflectivity.

Referring to FIG. 5, in a transmission region, when about 4.2V voltage is applied to the transmissive electrode, the transmissivity is saturated to maximum value that is about 40%. In a reflection region, when about 2.6V voltage is applied to the reflective electrode, the reflectivity corresponds to a maximum value that is about 38%.

As shown in FIG. 5, a voltage corresponding to the maximum reflectivity and a voltage corresponding to the maximum transmissivity are different from each other. Thus, different voltages are applied to the transmissive electrode and the reflective electrode so as to enhance the transmissivity and reflectivity. That is, about 4.2V voltage is applied to the transmissive electrode, and about 2.6V voltage is applied to the reflective electrode so as to enhance light using efficiency.

Referring again to FIGS. 3 and 4, a data voltage that is applied to the m-th data line DLm is transferred to the first drain electrode 125 of the first thin film transistor 120 in response to a driving signal that is applied to the n-th gate line GLn. The data voltage is dropped due to an internal resistance of the first thin film transistor 120, and the dropped data voltage is applied to the first drain electrode 125. The dropped data voltage (hereinafter, referred to as first data voltage) is applied to both of the transmissive electrode 150 that is electrically connected to the first drain electrode, and the second source electrode 133 of the second thin film transistor 130. The first data voltage is transferred from the second source electrode 133 to the second drain electrode 135 in response to the driving signal. However, the first data voltage is dropped again due to an internal resistance of the second thin film transistor 130 to be a second data voltage. Then, the second data voltage is applied to the reflective electrode 160 that is electrically connected to the second drain electrode 135.

Thus, even when one data voltage is applied to m-th data line DLm, different voltages are applied to the transmissive electrode 150 and the reflective electrode 160. Further, the internal resistance of the second thin film transistor 130 may be modulated so as to optimize the second data voltage. As a result, both of the transmissivity and the reflectivity are maximized to enhance the light using efficiency of the liquid crystal display device 400.

In the present embodiment, the transmissive electrode 150 and the reflective electrode 160 overlap with (n−1)-th gate line GLn-1 to form the first and second storage capacitors Cst1 and Cst2.

However, a separate wiring that is overlapped with the transmissive electrode 150 and the reflective electrode 160 may be formed so as to form the first and second storage capacitors Cst1 and Cst2.

Embodiment 2

Figure 6:
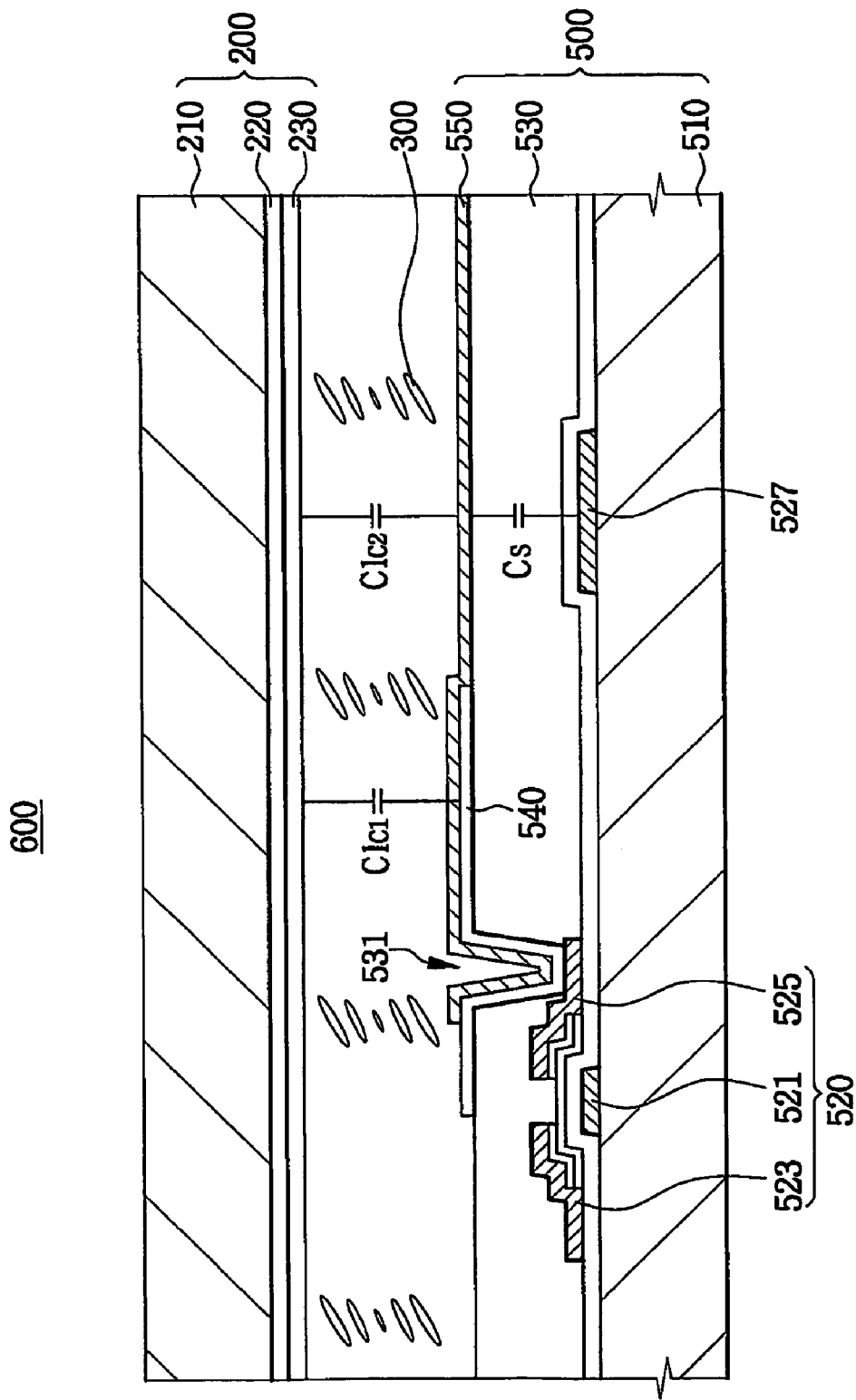
FIG. 6 is a cross-sectional-view showing a liquid crystal display apparatus according to a second exemplary embodiment of the present invention.

FIG. 6 is a cross-sectional view showing a liquid crystal display apparatus according to a second exemplary embodiment of the present invention.

Referring to FIG. 6, a liquid crystal display apparatus 600 according to a second exemplary embodiment of the present invention includes an array substrate 500, a color filter substrate 200 and a liquid crystal layer 300. The color filter substrate 200 faces the array substrate 500. The liquid crystal layer 300 is interposed between the array substrate 500 and the color filter substrate 200.

The array substrate 500 includes a plurality of pixels. The pixels are formed on a first substrate 510 such that the pixels are arranged in a matrix shape. Each of the pixels includes a data line (not shown) and a gate line (not shown). The data line extends in a first direction, and the gate line extends in a second direction that is substantially perpendicular to the first direction. The array substrate 500 further includes a thin film transistor 520. The thin film transistor 520 is disposed in a region defined by the data line and the gate line. The thin film transistor 520 is electrically connected to the data line and the gate line. The thin film transistor 520 includes a source electrode 523 that is electrically connected to the data line, a gate electrode 521 that is electrically connected to the gate line, and a drain electrode 525 that is electrically connected to both of a transmissive electrode 540 and a reflective electrode 550.

An insulation layer 530 is interposed between the thin film transistor 520 and the transmissive electrode 540 so as to electrically connect the transmissive electrode 540 only to the drain electrode 525 of the thin film transistor 520. The insulation layer 530 includes a contact hole 531, so that the transmissive electrode 540 is electrically connected to the drain electrode 525 via the contact hole 531.

The reflective electrode 550 overlaps with the transmissive electrode 540 partially. That is, a portion of the reflective electrode 550 is formed on the transmissive electrode 540. Thus, the reflective electrode 550 is electrically connected to the transmissive electrode 540.

The reflective electrode 550 faces a sub wiring 527. The sub wiring 527 protrudes from the gate line, so that the sub wiring 527 is formed on a same layer as the gate electrode 521.

The color filter substrate 200 includes a color filter layer 220 and a common electrode 230. The color filter layer 220 includes a red-color filter, a green color filter and a blue-color filter. The common electrode 230 is formed on the color filter layer 220. The common electrode 230 is transparent and electrically conductive. The liquid crystal layer 300 is interposed between the array substrate 500 and the color filter substrate 200.

Thus, the transmissive electrode 540, a liquid crystal layer 300 and the common electrode 230 define a first liquid crystal capacitor Clc1, and the reflective electrode 550, a liquid crystal layer 300 and the common electrode 230 define a second liquid crystal capacitor Clc2. The first and second liquid crystal capacitors Clc1 and Clc2 are electrically connected with each other in parallel. The first and second liquid crystal capacitors Clc1 and Clc2 are electrically connected to the thin film transistor 520. Further, the second liquid crystal capacitor Clc2 is electrically connected in parallel to a sub capacitor Cs that is formed by the reflective electrode 550, the insulation layer 530 and the sub wiring 527.

Figure 7:
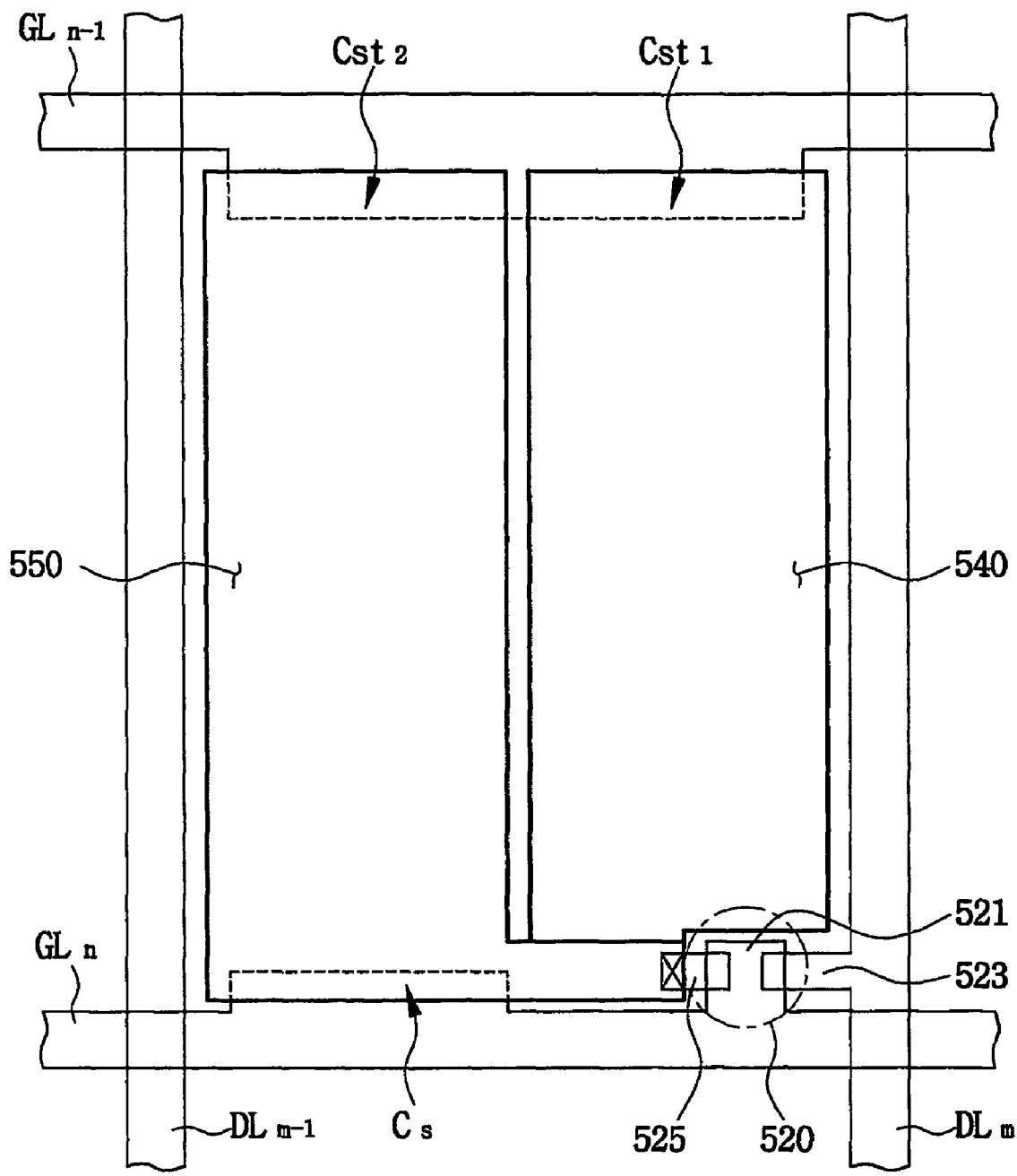
FIG. 7 is a layout showing a unit pixel of the liquid crystal display apparatus of FIG. 6.
Figure 8:
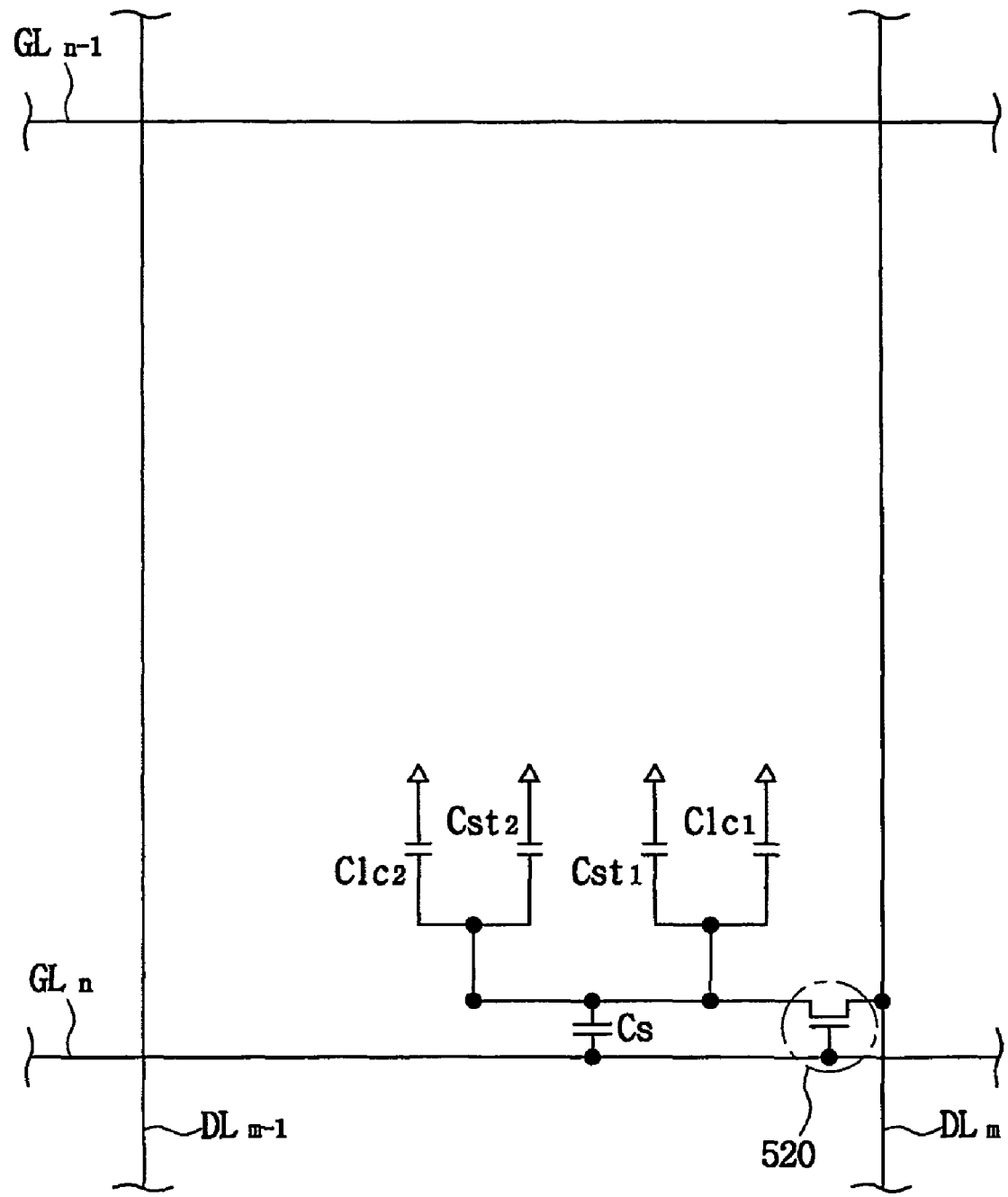
FIG. 8 is an equivalent circuit diagram of the unit pixel of FIG. 7.

FIG. 7 is a layout showing a unit pixel of the liquid crystal display apparatus of FIG. 6, and FIG. 8 is an equivalent circuit diagram of the unit pixel of FIG. 7.

Referring to FIGS. 7 and 8, a unit pixel includes an m-th data line DLm extending in a first direction, and an n-th gate line GLn extending in a second direction that is substantially perpendicular to the first direction.

A thin film transistor 520 is formed in a region that is defined by (m−1)-th and m-th data lines DLm-1 and DLm, and (n−1)-th and n-th gate line GLn-1 and GLn. The thin film transistor 520 includes a source electrode 523 that is electrically connected to the m-th data line DLm, a gate electrode 521 that is electrically connected to the n-th gate line GLn, and a drain electrode 525 that is electrically connected to the transmissive electrode 540 and the reflective electrode 550.

The transmissive electrode 540 faces the common electrode with the liquid crystal layer interposed therebetween, so that the second liquid crystal capacitor Clc2 is formed. The reflective electrode 550 overlaps with the (n−1)-th gate line GLn-1 while the insulation layer is interposed therebetween. Thus, a second storage capacitor Cst2 that is electrically connected in parallel to the second liquid crystal capacitor Clc2 is formed. Further, the reflective electrode 550 overlaps with the n-th gate line GLn while the insulation layer is interposed therebetween. Thus, the sub capacitor Cs that is electrically connected in parallel to the second liquid crystal capacitor Clc2 and the second storage capacitor Cst2 is formed.

When the thin film transistor 520 operates in response to a driving signal that is applied to the n-th gate line GLn, a data voltage that is applied to the m-th data line DLm is transferred to the drain electrode 525. Then, the data voltage is applied to the transmissive electrode 540 and the reflective electrode 550 that are electrically connected to the drain electrode 525. In detail, a first data voltage is applied to the transmissive electrode 540, and a second data voltage is applied to the reflective electrode 550. The second data voltage is lower than the first data voltage. That is, the first data voltage is dropped due to the sub capacitor Cs that is electrically connected to the reflective electrode 550, so that the second data voltage is formed. Then, the second data voltage is applied to reflective electrode 550.

As described above, even when one data voltage is applied to m-th data line DLm, different voltages are applied to the transmissive electrode 540 and the reflective electrode 550. As a result, both of the transmissivity and the reflectivity are maximized to enhance the light using efficiency of the liquid crystal display device 600.

In the present embodiment, the reflective electrode 550 overlaps with the n-th gate line GLn to form the sub capacitor Cs. However, a separate wiring may overlap with the reflective electrode 550 so as to form the sub capacitor Cs.

Embodiment 3

Figure 9:
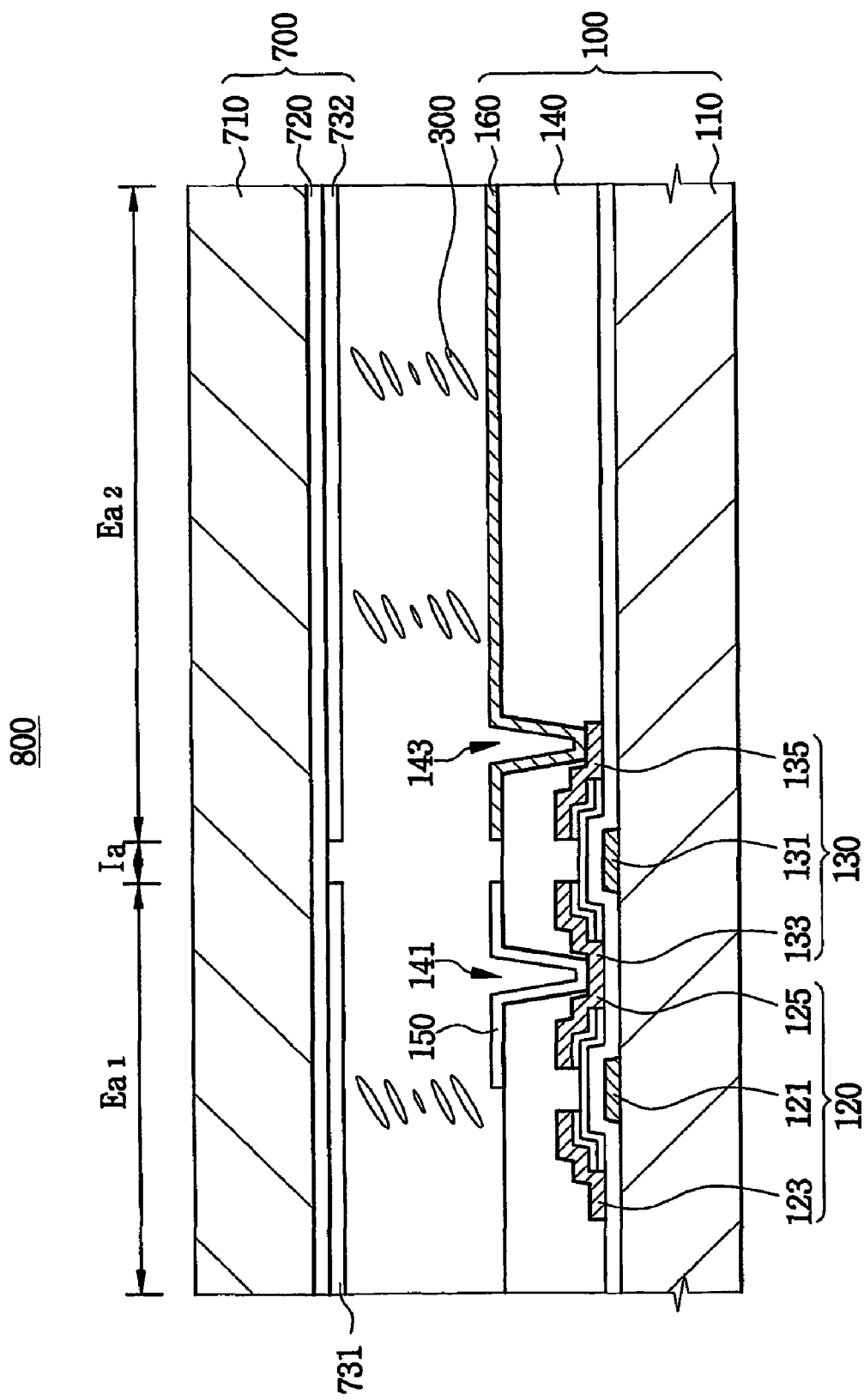
FIG. 9 is a cross-sectional view showing a liquid crystal display apparatus according to a third exemplary embodiment of the present invention.
Figure 10:
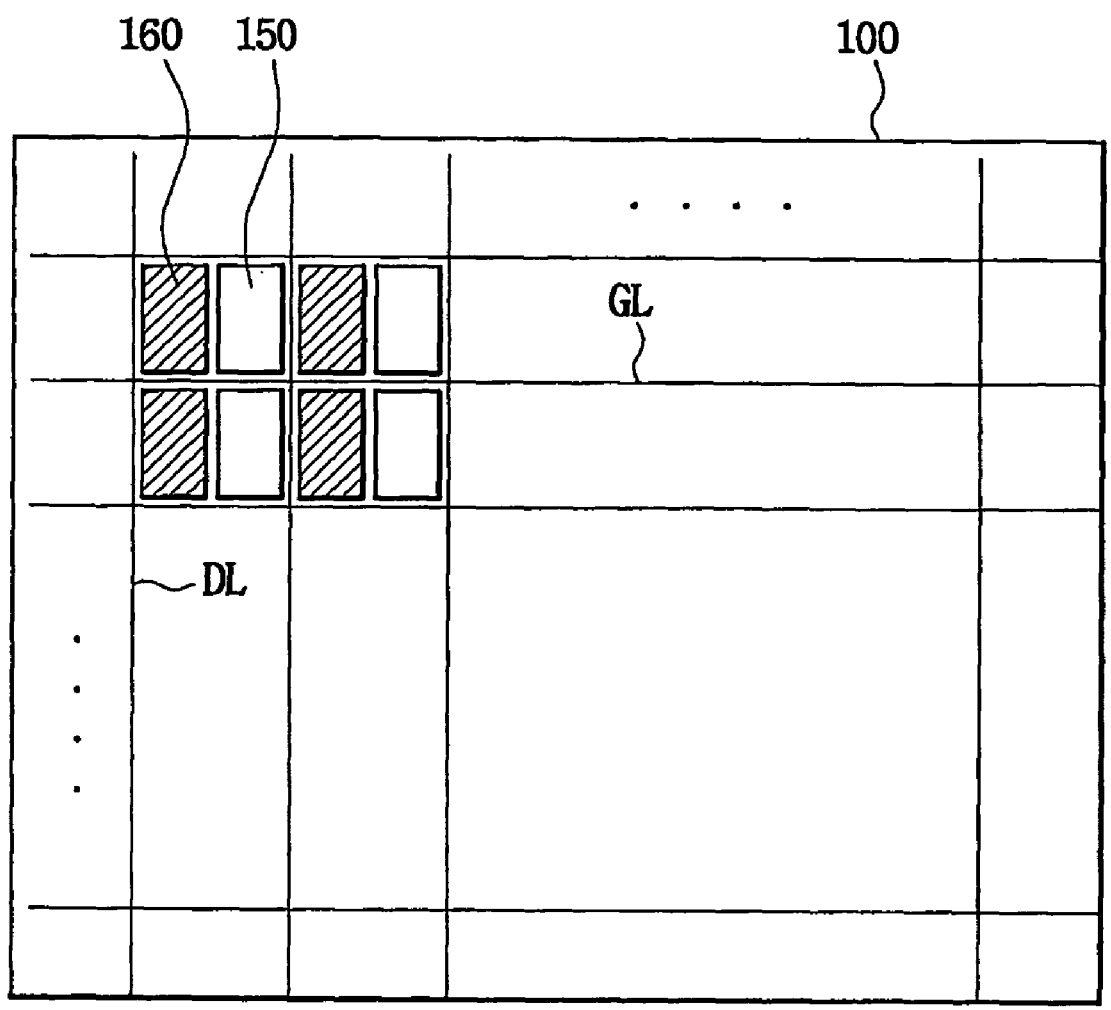
FIG. 10 is a schematic plan view showing an array substrate of FIG. 9.
Figure 11:
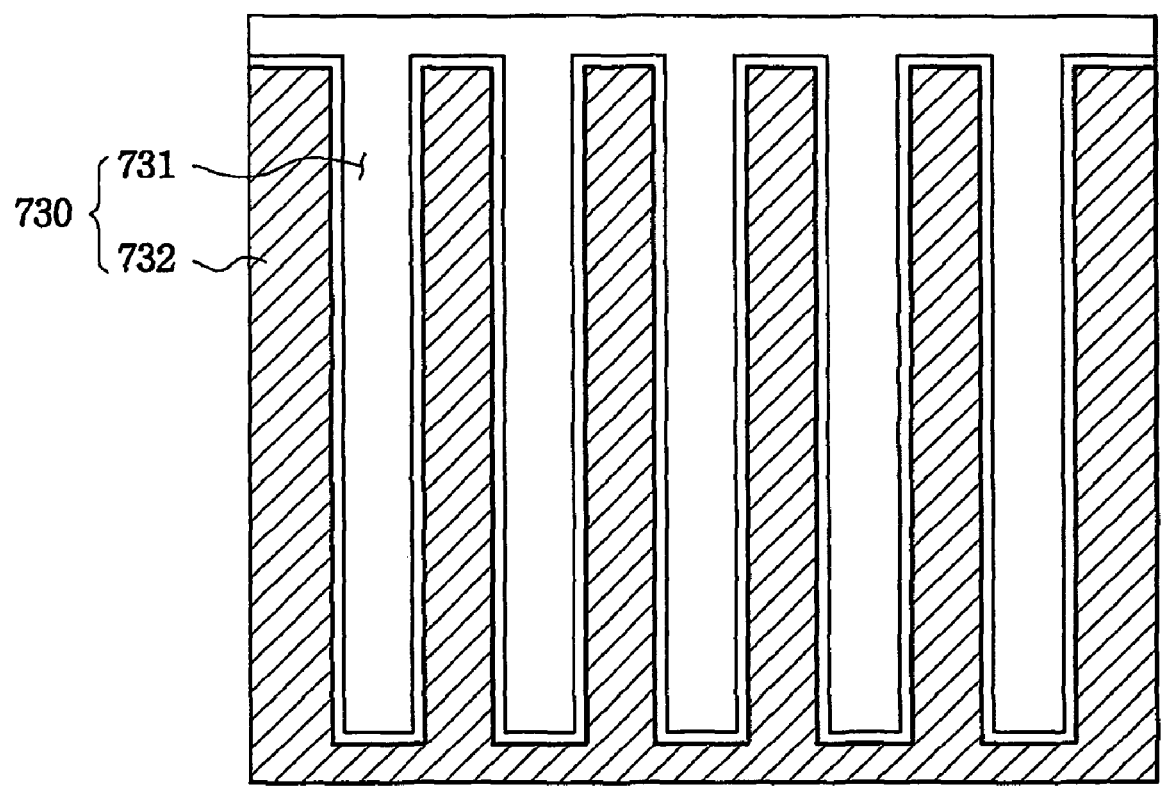
FIG. 11 is a schematic plan view showing a color filter substrate of FIG. 9.

FIG. 9 is a cross-sectional view showing a liquid crystal display apparatus according to a third exemplary embodiment of the present invention. FIG. 10 is a schematic plan view showing an array substrate of FIG. 9, and FIG. 11 is a schematic plan view showing a color filter substrate of FIG. 9. The liquid crystal display apparatus is same as in Embodiment 1 except for a color filter substrate 700. Thus, the same reference numerals will be used to refer to the same or like parts as those described in Embodiment 1 and any further explanation will be omitted.

Referring to FIGS. 9 to 11, a liquid crystal display apparatus according to a third exemplary embodiment of the present invention includes an array substrate 100, a color filter substrate 700 that faces the array substrate 100, and a liquid crystal layer 300 that is interposed between the array substrate 100 and the color filter substrate 700.

The color filter substrate 700 includes a color filter layer 720 formed on a second substrate 710, and a common electrode 730 that is formed on the color filter layer 720. The color filter layer 720 includes a red-color filter, a green-color filter and a blue-color filter. The common electrode 730 is transparent and electrically conductive.

As shown in FIGS. 9 and 11, the common electrode 730 includes first and second common electrode regions Ea1 and Ea2. First and second common electrodes 731 and 732 are formed in the first and second common electrode region Ea1 and Ea2 respectively. The first common electrode 731 corresponds to the transmissive electrode of the array substrate. The second common electrode 732 corresponds to the reflective electrode of the array substrate. The first and second common electrodes 731 and 732 are electrically insulated from each other. That is, an insulation region Ia is interposed between the first and second common electrode regions Ea1 and Ea2.

First and second reference voltages are applied to the first and second common electrodes 731 and 732 respectively. The second reference voltage is lower than the first reference voltage.

As shown in FIGS. 9 and 11, the array substrate 100 includes first and second thin film transistors 120 and 130 so as to apply different voltages to the transmissive electrode 150 and the reflective electrode 160. That is, a first data voltage is applied to the transmissive electrode, and a second data voltage that is lower than the first data voltage is applied to the reflective electrode. In this case, a preferred reference voltage level in the reflection region and a preferred reference voltage level in the transmissive region become different due to differences such as parasitic capacitance, discharge rate, etc. between the first and second thin film transistors 120 and 130.

Thus, when the preferred reference voltage is adjusted to the transmission region, a leakage current flows in the reflection region. When the preferred reference voltage is adjusted to the reflection region, a leakage current flows in the transmission region. That is, the first data voltage applied to the liquid crystal layer of the transmission region becomes different between the positive (+) frame and the negative (−) frame, and the second data voltage applied to the liquid crystal layer of the reflection region becomes different between the positive (+) frame and the negative (−) frame.

This voltage difference induces luminance differences between the reflection region and the transmission region. Further, the voltage difference induces luminance difference between the positive frame and the negative frame. Thus, an image displayed from the liquid crystal display apparatus 400 flickers, so that the display quality is deteriorated.

In order to solve this problem, the first reference voltage is applied to the first common electrode 731 that faces the transmissive electrode 150, and the second reference voltage that is lower than the first reference voltage is applied to the second common electrode 732 that faces the reflective electrode 160. Thus, the first and second data voltages are prevented from being different between the positive frame and the negative frame in the transmission region and the reflection region respectively.

The liquid crystal layer 300 is interposed between the array substrate 100 and the color filter substrate 700 to form the liquid crystal display apparatus 800.

In the present embodiment, a plurality of electrode regions are defined in a pixel region due to the transmissive electrode 150 and the reflective electrode 160. However, as long as a plurality of electrode regions is formed in the pixel region, a plurality of common electrode regions corresponding to the electrode regions may be formed on the common electrode of the color filter substrate.

Embodiment 4

Figure 12:
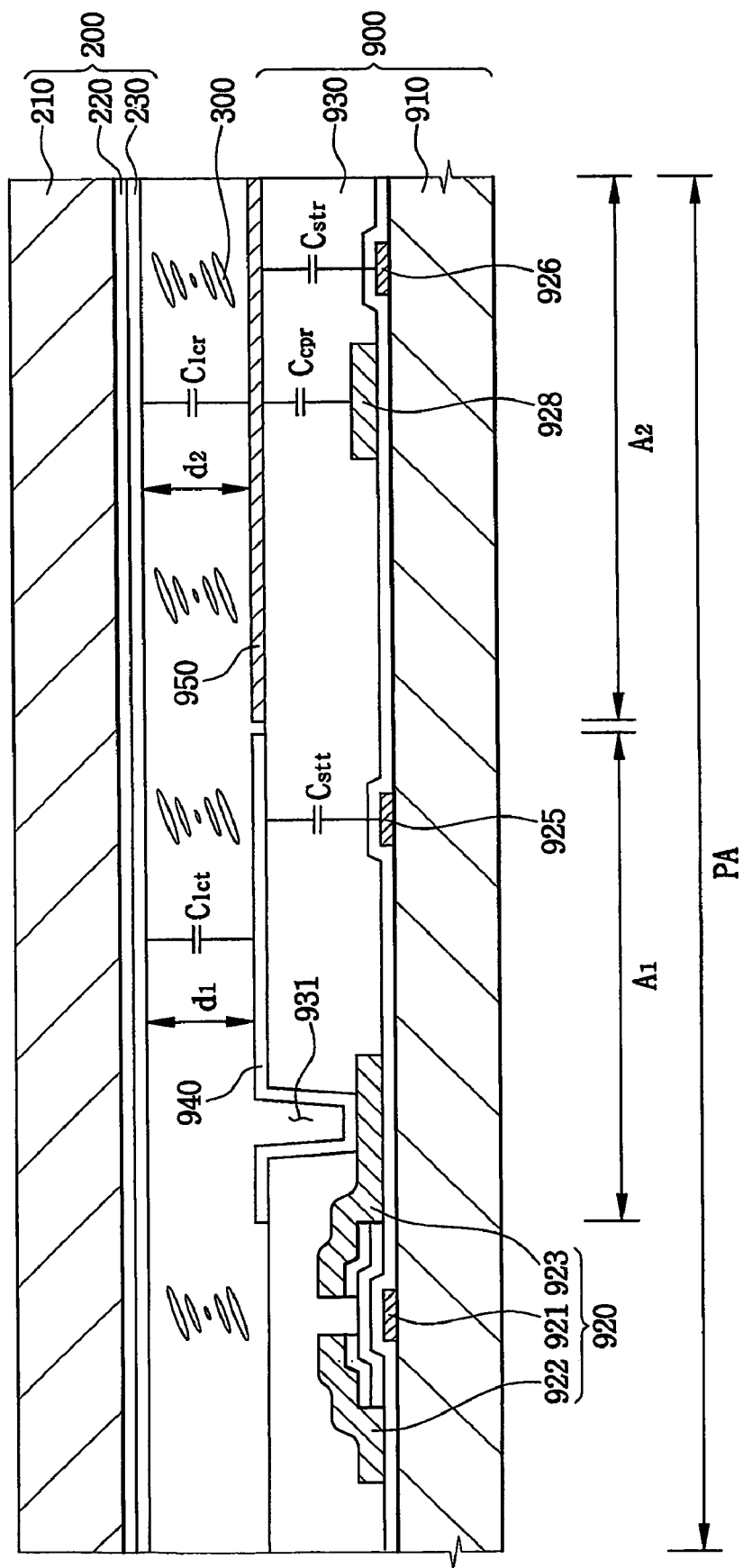
FIG. 12 is a cross-sectional view showing a liquid crystal display apparatus according to a fourth exemplary embodiment of the present invention.
Figure 13:
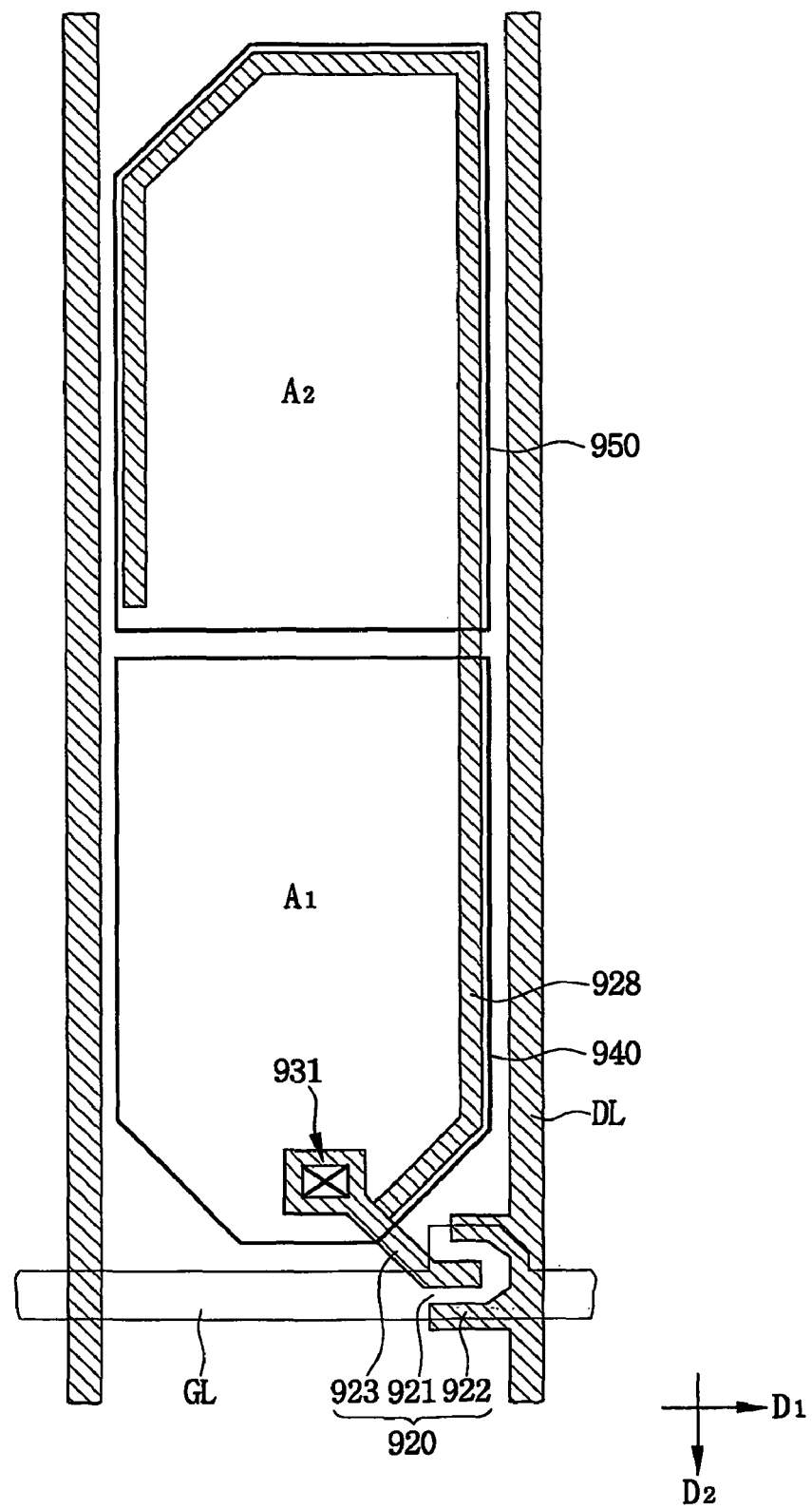
FIG. 13 is a schematic plan view showing an array substrate of FIG. 12.

FIG. 12 is a cross-sectional view showing a liquid crystal display apparatus according to a fourth exemplary embodiment of the present invention, and FIG. 13 is a schematic plan view showing an array substrate of FIG. 12.

Referring to FIGS. 12 and 13, a liquid crystal display apparatus 1000 according to a fourth exemplary embodiment of the present invention includes an array substrate 900, a color filter substrate 200 and a liquid crystal display layer 300 that is interposed therebetween.

The array substrate 900 includes a first substrate 910, a gate line GL, a data line DL, a thin film transistor 920, a transmissive electrode 940 and a reflective electrode 950.

The gate line GL extends in a first direction D1, and the data line DL extends in a second direction D2 that is substantially perpendicular to the first direction D1. However, the gate line GL and the data line DL are electrically insulated from each other. A pixel region PA is defined by the gate line GL and the data line DL.

The thin film transistor 920 of the pixel region PA includes a gate electrode 921 that is electrically connected to the gate line GL, a source electrode 922 that is electrically connected to the data line DL, and a drain electrode 923 that is electrically connected to the transmissive electrode 940.

A protection layer 930 is interposed between the transmissive electrode 940 and the thin film transistor 920. The protection layer 930 includes a first contact hole 931 for exposing the drain electrode 923 of the thin film transistor 920.

The transmissive electrode 940 is formed on the protection layer 930, such that the transmissive electrode 940 is electrically connected to the drain electrode 923 via the first contact hole 931.

The pixel region PA includes first and second regions A1 and A2. The transmissive electrode 940 is formed in the first region A1. The reflective electrode 950 is electrically insulated from the transmissive electrode 940, and the reflective electrode 950 is formed in the second region A2.

A first sub wiring 925 is formed in the first region A1, such that the first sub wiring 925 is electrically insulated from the transmissive electrode 940 and the first sub wiring 925 faces the transmissive electrode 940. A second sub wiring 926 is formed in the second region A2, such that the second sub wiring 926 is electrically insulated from the reflective electrode 950 and the second sub wiring 926 faces the reflective electrode 950. The first and second sub wirings 925 and 926 are patterned simultaneously with the gate line GL. That is, the first and second sub wirings 925 and 926 are formed simultaneously with the gate line GL.

A compensation wiring 928 is formed over the first substrate 910. The compensation wiring 928 is electrically connected to the drain electrode 923 of the thin film transistor 920. The compensation wiring 928 faces the reflective electrode 950 while the compensation wiring 928 is electrically insulated from the reflective electrode 950.

In FIGS. 12 and 13, for example, the compensation wiring 928 is patterned simultaneously with the data line DL. However, the compensation wiring 928 may be patterned simultaneously with the gate line GL.

The color filter substrate 200 includes a second substrate 210, a color filter 220 that is formed on the second substrate 210, and a common electrode 230 that is formed on the color filter 220. The color filter substrate 200 and the array substrate 900 are assembled together, such that the common electrode 230 faces the transmissive electrode 940 and the reflective electrode 950. Then, a liquid crystal material is injected between the color filter substrate 200 and the array substrate 900 to form the liquid crystal layer 300. Thus, the liquid crystal display apparatus 1000 are completed.

A first distance d1 between the common electrode 230 and the transmissive electrode 940 of the first region A1 is substantially same as a second distance d2 between the common electrode 230 and the reflective electrode 950. That is, the liquid crystal display apparatus 1000 has a uniform cell gap in the first and second regions A1 and A2.

Figure 14:
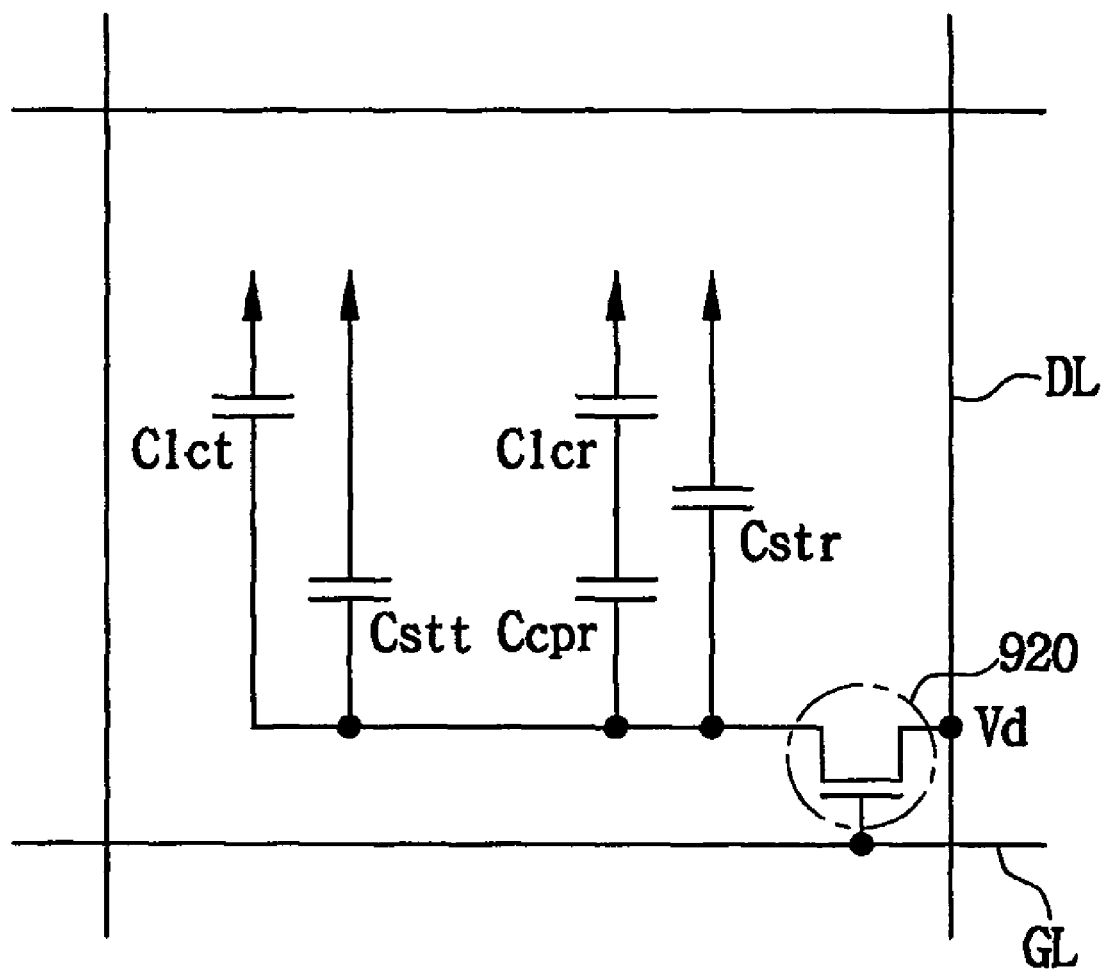
FIG. 14 is an equivalent circuit diagram of the unit pixel of FIG. 12.

FIG. 14 is an equivalent circuit diagram of the unit pixel of FIG. 12.

Referring to FIGS. 12 to 14, a unit pixel includes a gate line GL and a data line DL. The thin film transistor 920 is electrically connected to the gate line GL and the data line DL. The thin film transistor 920 includes a drain electrode 923 that is electrically connected to a first liquid crystal capacitor Clct, a first sub capacitor Cstt, a compensation capacitor Ccpr and a second sub capacitor Cstr. The compensation capacitor Ccpr is electrically connected in series to a second liquid crystal capacitor Clcr. The first liquid crystal capacitor Clct, the first sub capacitor Cstt, a composite capacitor of the compensation capacitor Ccpr and the second liquid crystal capacitor Clcr, and the second sub capacitor Cstr are electrically connected in parallel with each other.

The first liquid crystal capacitor Clct corresponds to a capacitance formed between the common electrode 230 of the color filter substrate 200 and the transmissive electrode 940 of the array substrate 900.

The first sub capacitor Clst corresponds to a capacitance formed between the first sub wiring 925 of the array substrate 900 and the transmissive electrode 940.

The second sub capacitor Cstr corresponds to a capacitance formed between the second sub wiring 926 of the array substrate 900 and the reflective electrode 950.

The second liquid crystal capacitor Clcr corresponds to a capacitance formed between the reflective electrode 950 and the common electrode 230.

The compensation capacitor Ccpr corresponds to a capacitance formed between the reflective electrode 950 and the compensation wiring 928. The capacitance of the compensation capacitor Ccpr increases in directly proportional to an overlapping area of the reflective electrode 950 and the compensation wiring 928.

When a gate voltage applied to the gate line GL is transferred to the gate electrode 921 of the thin film transistor 920, the thin film transistor 920 is turned on. Thus, a data voltage Vd applied to the source electrode 922 from the data line DL is transferred to the drain electrode 923. Then, the data voltage Vd is applied to the transmissive electrode 940 and the compensation wiring 928.

A reference voltage, for example 0V is applied to the common electrode 230 of the color filter substrate 200.

When the data voltage Vd is applied to the transmissive electrode 940 via the thin film transistor 920, the first liquid crystal capacitor Clct is electrically charged according to the data voltage Vd. However, the second liquid crystal capacitor Clcr is electrically charged according to a compensated voltage Vr that is lower than the data voltage Vd. That is, the data voltage Vd is divided by the compensation capacitor Ccpr and the second liquid crystal capacitor Clcr, so that the compensated voltage is obtained as the following expression 1.

$$Vr = Vd \times Ccpr/(Cpr + Clcr).$$ Expression 1

As shown in Expression 1, a sum of the compensation capacitor Ccpr and the second liquid crystal capacitor Clcr is greater than the compensation capacitor Ccpr, so that the compensated voltage Vr is lower than the data voltage Vd. Thus, the data voltage Vd (or a first data voltage) that is applied to the transmissive electrode 940 is higher than the compensated voltage Vr (or second data voltage) that is applied to the reflective electrode 950.

Embodiment 5

Figure 15:
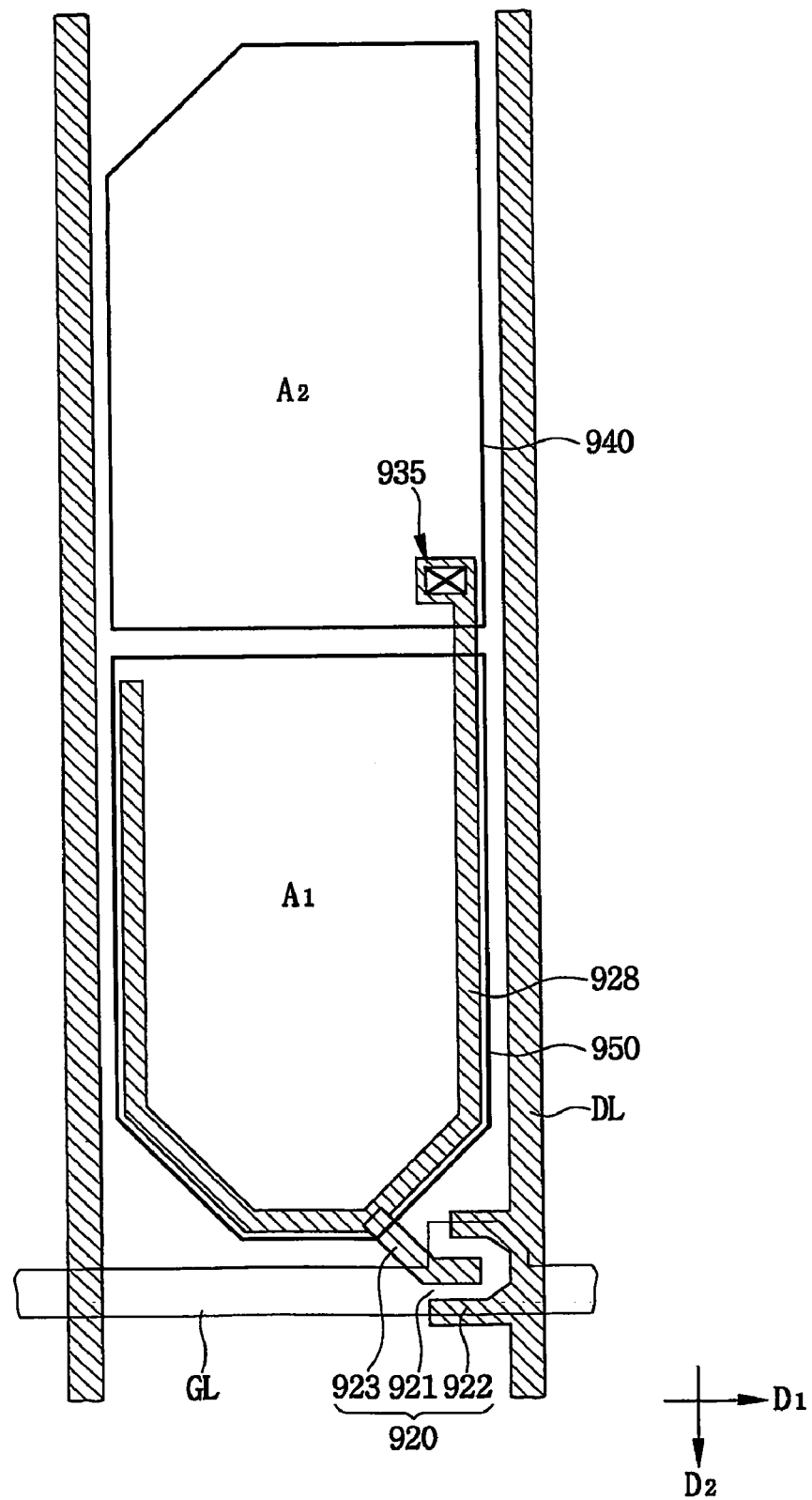
FIG. 15 is a plan view showing an array substrate according to a fifth exemplary embodiment of the present invention.

FIG. 15 is a plan view showing an array substrate of a liquid crystal display apparatus according to a fifth exemplary embodiment of the present invention.

Referring to FIG. 15, an array substrate 901 of a liquid crystal display apparatus according to a fifth exemplary embodiment of the present invention, includes a first substrate 910, a gate line GL, a data line DL, a thin film transistor 920, a transmissive electrode 940, a reflective electrode 950 and a compensation wiring 928.

The gate line GL extends in a first direction D1, and the data line DL extends in a second direction D2 that is substantially perpendicular to the first direction D1. The gate line GL and the data line DL are electrically insulated from each other. A pixel region is defined by the gate line GL and the data line DL. The compensation wiring 928 faces the reflective electrode 950 in the pixel region.

The thin film transistor 920 includes a gate electrode 921 that is electrically connected to the gate line GL, a source electrode 922 that is electrically connected to the data line DL, and a drain electrode 923 that is electrically connected to the compensation wiring 928.

The pixel region includes first and second regions A1 and A2. The transmissive electrode 940 is formed in the first region A1. The reflective electrode 950 is formed in the second region A2, such that the reflective electrode 950 is electrically insulated from the transmissive electrode 940. The transmissive electrode 940 is electrically connected to the compensation wiring 928 via a second contact hole 935. Thus, the transmissive electrode 940 is electrically connected to the drain electrode 923 of the thin film transistor 923 via the compensation wiring 928.

Embodiment 6

Figure 16:
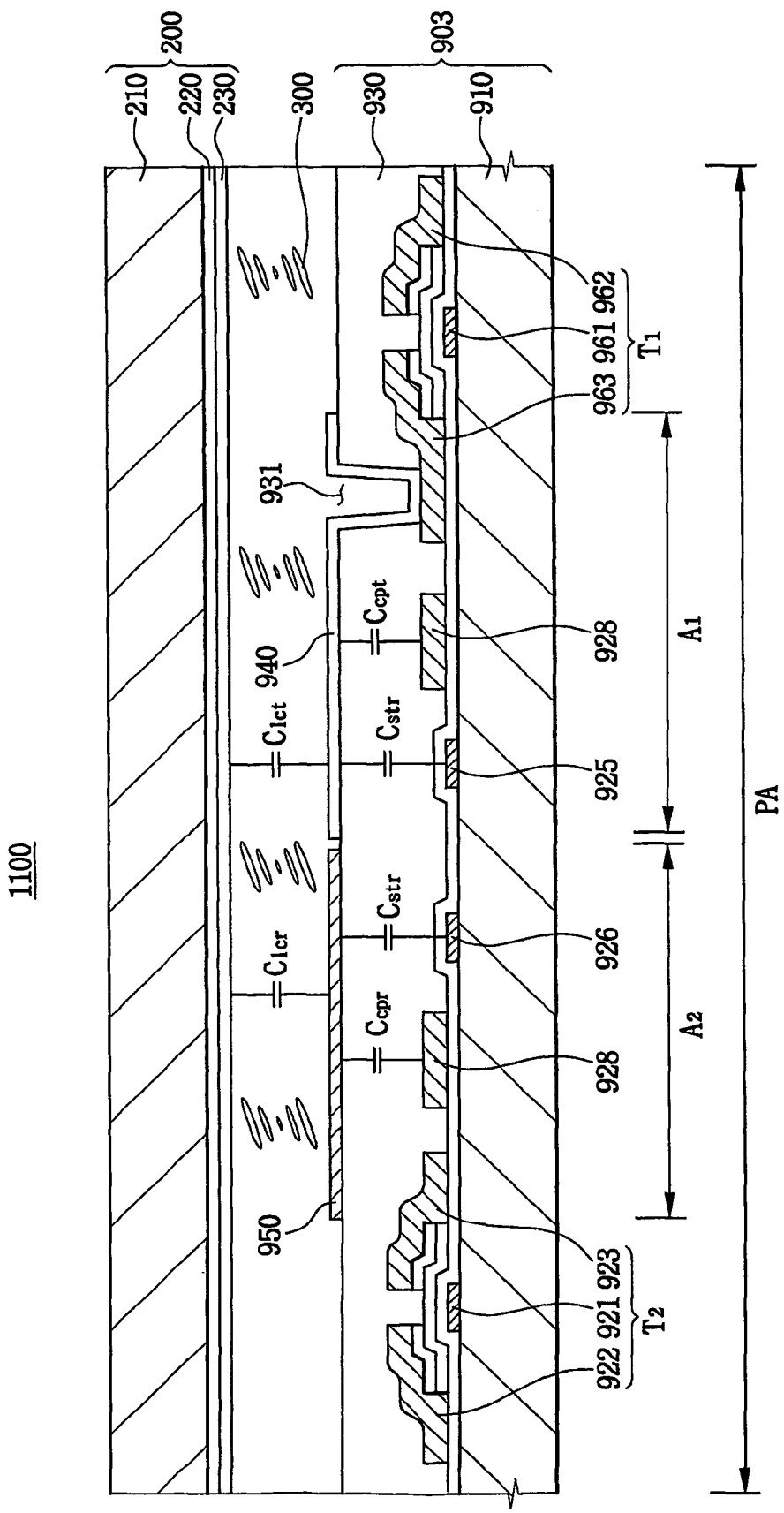
FIG. 16 is a cross-sectional view showing a liquid crystal display apparatus according to a sixth exemplary embodiment of the present invention.
Figure 17:
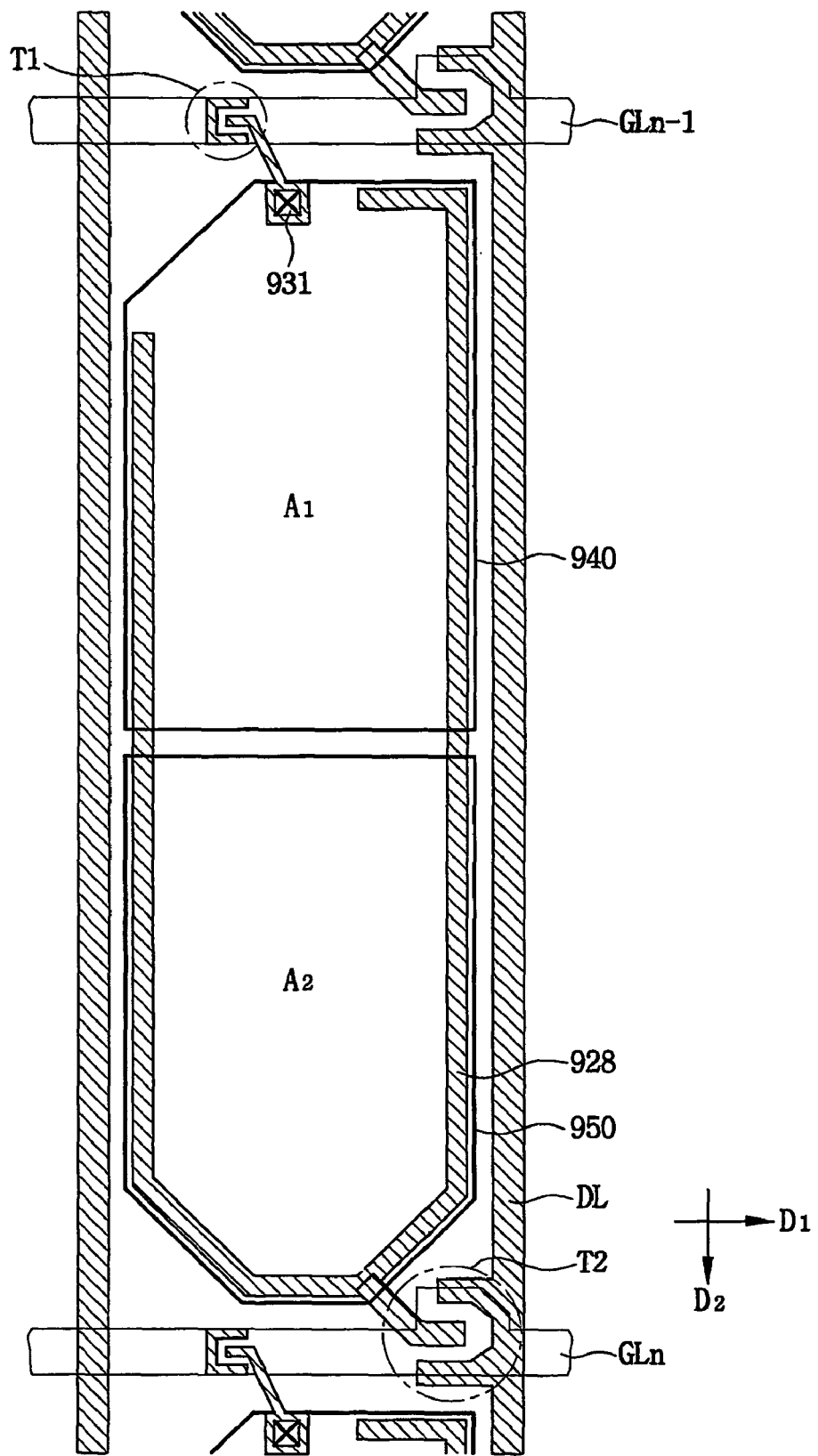
FIG. 17 is a layout showing a portion of an array substrate of FIG. 16.

FIG. 16 is a cross-sectional view showing a liquid crystal display apparatus according to a sixth exemplary embodiment of the present invention, and FIG. 17 is a layout showing a portion of an array substrate of FIG. 16.

Referring to FIGS. 16 and 17, a liquid crystal display apparatus 1100 according to a sixth exemplary embodiment of the present invention includes an array substrate 903, a color filter substrate 200 and a liquid crystal layer 300 interposed between the array substrate 903 and the color filter substrate 200.

The array substrate 903 includes a first substrate 910, a first gate line GLn-1, a second gate line GLn, a data line DL, a first thin film transistor T1, a second thin film transistor T2, a transmissive electrode 940, a reflective electrode 950 and a compensation wiring 928, wherein 'n' is a natural number that is greater than two.

The array substrate 903 includes a plurality of gate lines. The first gate line GLn-1 corresponds to (n−1)-th gate line, and the second gate line GLn corresponds to n-th gate line.

Both of the first and second gate lines GLn-1 and GLn extend in a first direction D1, such that the first and second gate lines GLn-1 and GLn are spaced apart with each other. The data line DL extends in a second direction D2 that is substantially perpendicular to the first direction D1. The data line DL is electrically insulated from the first and second gate lines GLn-1 and GLn. A pixel region PA is defined by the first and second gate lines GLn-1 and GLn, and the data line DL.

The first thin film transistor T1 includes a first gate electrode 961 that is electrically connected to the first gate line GLn-1, a source electrode 962 that is electrically connected to a ground voltage, and a drain electrode 963 that is electrically connected to the transmissive electrode 940. The pixel region PA includes first and second regions A1 and A2. The transmissive electrode 940 is formed in the first region A1. The compensation wiring 928 faces the transmissive electrode 940 in the first region A1.

The second thin film transistor T2 includes a second gate electrode 921 that is electrically connected to the second gate line GLn, a second source electrode 922 that is electrically connected to the data line DL, and a second drain electrode 923 that is electrically connected to the compensation wiring 928. The reflective electrode 950 is formed in the second region A2, such that the reflective electrode is electrically insulated from the transmissive electrode 940. The compensation wiring 928 faces the reflective electrode 940 in the second region A2.

A protection layer 930 is coated on the first substrate 910 having the first and second thin film transistors T1 and T2 formed thereon. The protection layer 930 corresponds to an organic insulation layer. The protection layer 930 electrically insulate the transmissive electrode 940 from the compensation wiring 928 in the first region A1, and the protection layer also electrically insulate the reflective electrode 950 from the compensation wiring 928 in the second region A2.

The protection layer 930 includes a contact hole 931 for exposing the first drain electrode 963 of the first thin film transistor T1. The transmissive electrode 940 is formed on the protection layer 930, such that the transmissive electrode 940 is electrically connected to the first drain electrode 963 via the contact hole 931.

A first sub wiring 925 is formed in the first region A1, such that the first sub wiring 925 is insulated from the transmissive electrode 940. The first sub wiring 925 faces the transmissive electrode 940. A second sub wiring 926 is formed in the second region A2, such that the second sub wiring 926 is insulated from the reflective electrode 950. The second sub wiring 926 faces the reflective electrode 950.

The color filter substrate 200 includes a second substrate 210, a color filter 220 formed on the second substrate 210, and a common electrode 230 formed on the color filter 220.

A first distance d1 between the common electrode 230 and the transmissive electrode 940 in the first region A1 is substantially same as a second distance d2 between the common electrode 230 and the reflective electrode 950 in the second region A2. That is, the liquid crystal display apparatus 1100 has a uniform cell gap in the first region A1 and the second region A2.

Figure 18:
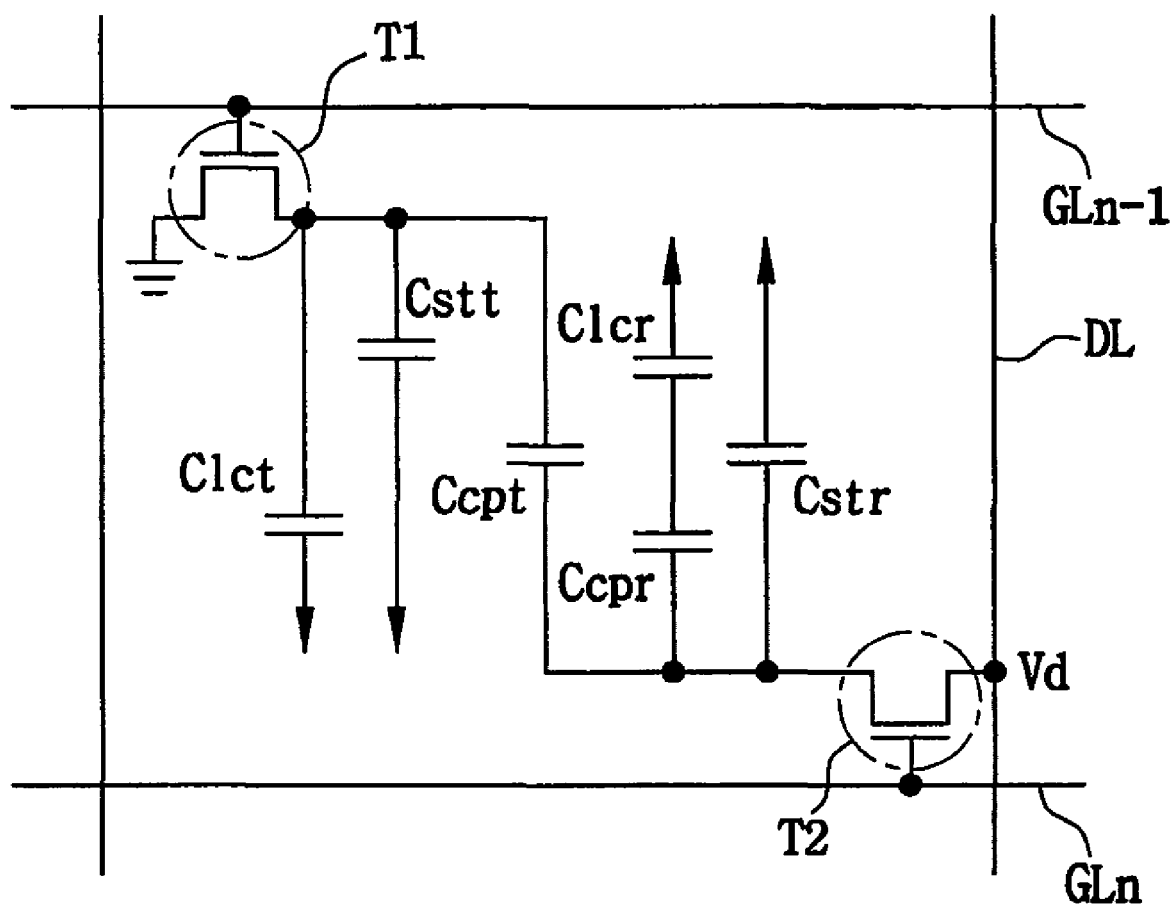
FIG. 18 is an equivalent circuit diagram of a unit pixel of FIG. 17.

FIG. 18 is an equivalent circuit diagram of a unit pixel of FIG. 17.

Referring to FIGS. 17 and 18, a unit pixel includes first and second gate lines GLn-1 and GLn, and a data line DL. The first and second gate lines GLn-1 and the GLn are spaced apart from each other. The first thin film transistor T1 includes a first gate electrode that is electrically connected to the first gate line GLn-1, a first source electrode that is electrically connected to a ground voltage. The second thin film transistor T2 includes a second gate electrode that is electrically connected to the second gate line GLn, and a second source electrode that is electrically connected to the data line DL.

A first drain electrode of the first thin film transistor T1 is electrically connected to a first liquid crystal capacitor Clct and a first sub capacitor Cstt. The first liquid crystal capacitor Clct and the first sub capacitor Cstt are electrically connected in parallel with each other. A second drain electrode of the second thin film transistor T2 is electrically connected to a second compensating capacitor Ccpr and a second sub capacitor Cstr. The second compensating capacitor Ccpr is electrically connected in series to a second liquid crystal capacitor Clcr. A composite capacitor of the second compensating capacitor Ccpr and the second liquid crystal capacitor Clcr is electrically connected in parallel to the second sub capacitor Cstr.

A first compensating capacitor Ccpt electrically connects the first and second thin film transistor T1 and T2. That is, the first drain electrode of the first thin film transistor T1 is electrically connected to a first terminal of the first compensating capacitor Ccpt, and the second drain electrode of the second thin film transistor T2 is electrically connected to a second terminal of the first compensating capacitor Ccpt.

The first liquid crystal capacitor Clct corresponds to a capacitance formed between the common electrode 230 of the color filter substrate 200 and the transmissive electrode 940 of the array substrate 903.

The first sub capacitor Cstt corresponds to a capacitance formed between the first sub wiring 925 and the transmissive electrode 940.

The second sub capacitor Cstr corresponds to a capacitance formed between the second sub wiring 926 and the reflective electrode 950.

The second liquid crystal capacitor Clcr corresponds to a capacitance formed between the reflective electrode 950 and the common electrode 230.

The first compensating capacitor Ccpt corresponds to a capacitance formed between the transmissive electrode 940 and the compensating wiring 928.

The second compensating capacitor Ccpr corresponds to a capacitance formed between the reflective electrode 950 and the compensating wiring 928.

When a first gate voltage is applied to the first gate line GLn-1, the first gate voltage is transferred to the first gate electrode of the first thin film transistor T1, so that the first thin film transistor T1 is turned on. Then, the ground voltage that is applied to the first source electrode of the first thin film transistor T1 is outputted via the first drain electrode. However, the second thin film transistor T2 is in a turned off state, so that a voltage of the second drain electrode of the second thin film transistor T2 is lower than a voltage of the first drain electrode of the first thin film transistor T1. That is, the voltage of the second drain electrode is negative.

Thus, when the first thin film transistor T1 is turned on, a transmissive voltage Vt (or first data voltage) that is applied to the transmissive electrode 940 is higher than a reflective voltage (or second data voltage) that is applied to the reflective electrode 950.

When a second gate voltage is applied to the second gate line GLn, the second gate voltage is transferred to the second gate electrode of the second thin film transistor T2. Thus, the second thin film transistor T2 is turned on.

The first gate voltage is applied to the first gate line GLn-1, until the second gate voltage is applied to the second gate line GLn, so that the first thin film transistor T1 is turned off, and the second thin film transistor T2 is turned on simultaneously. When the first thin film transistor T1 is turned off, the transmissive electrode 140 becomes a floating state.

Then, a data voltage Vd that is applied to the second source electrode from the data line DL is outputted via the second drain electrode of the second thin film transistor T2, so that the reflective voltage Vr and the transmissive voltage Vt are raised due to the data voltage Vd. The transmissive voltage Vt is higher than the reflective voltage Vr.

First, second and third capacitance C1, C2 and C3 are defined as the following Expression 2.

$$C1=Cstr+(Ccpr \times Clcr)/(Ccpr+Clcr)$$

$$C2=Ccpt$$

$$C3=Clct+Cstt. \qquad \text{Expression 2}$$

Then, when the second thin film transistor T2 is turned on, the transmissive voltage Vt that is applied to the transmissive electrode 940 is expressed as the following Expression 3.

$$Vt=1/(C1+2C2)\times(2-C3/C2)\times(C1+C2)\times Vd \qquad \text{Expression 3}$$

As shown in Expression 3, the transmissive voltage Vt is higher than the data voltage Vd.

Embodiment 7

Figure 19:
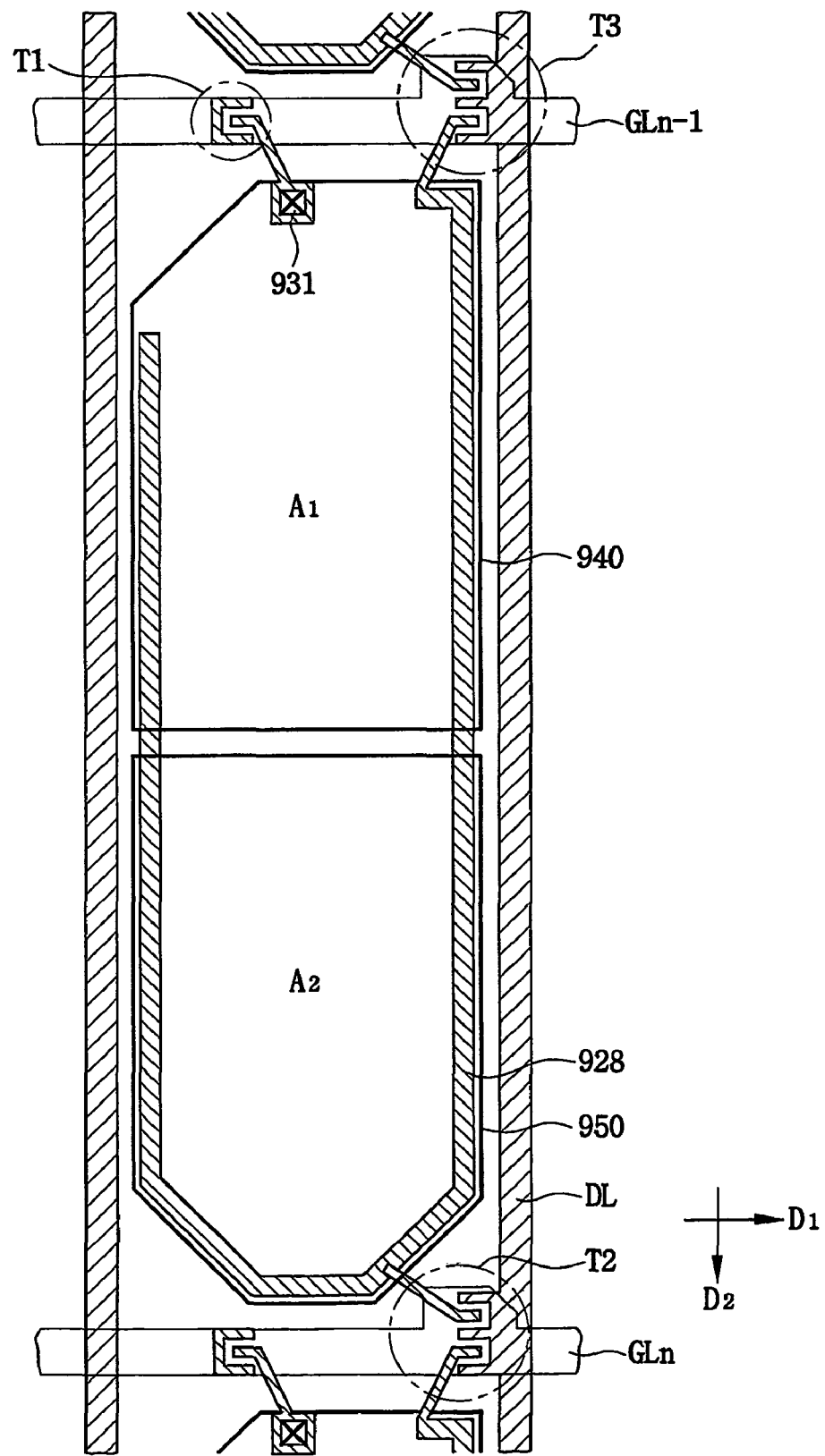
FIG. 19 is a layout showing an array substrate of a liquid crystal display apparatus according to a seventh exemplary embodiment of the present invention.
Figure 20:
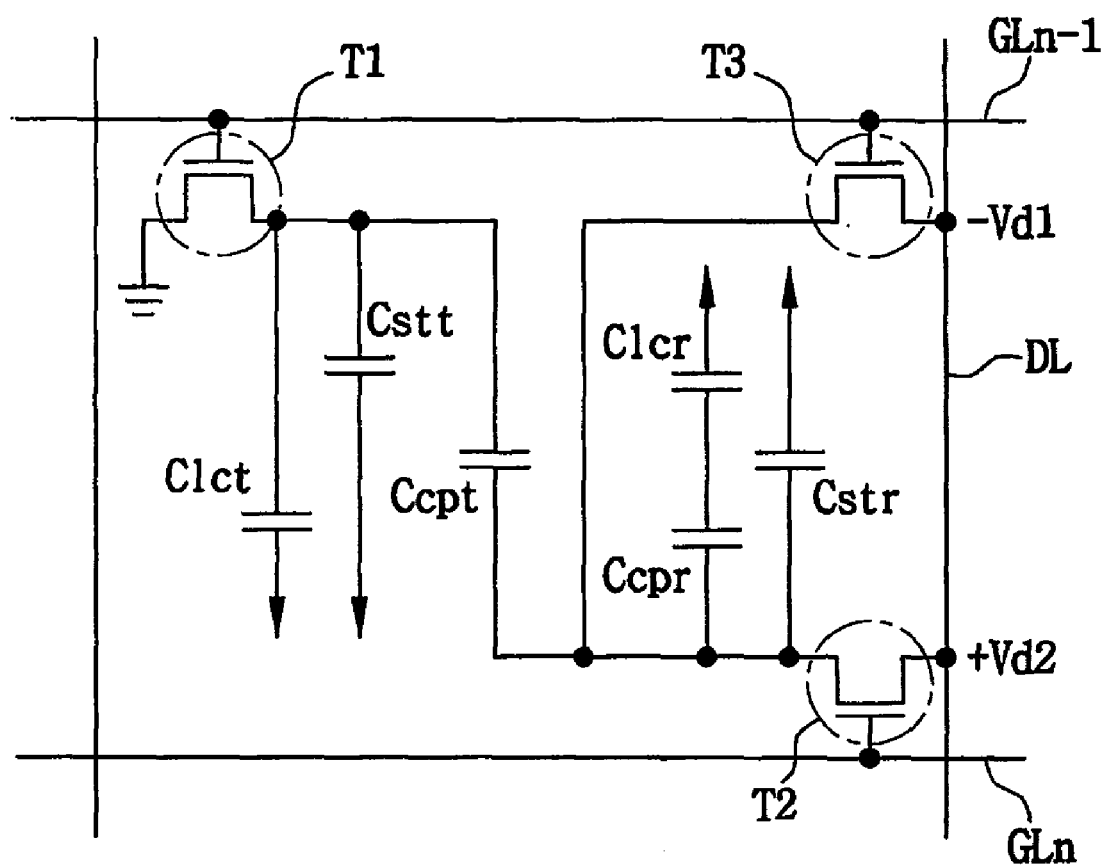
FIG. 20 is an equivalent circuit diagram showing a unit pixel of the liquid crystal display apparatus.

FIG. 19 is a layout showing an array substrate of a liquid crystal display apparatus according to a seventh exemplary embodiment of the present invention, and FIG. 20 is an equivalent circuit diagram showing a unit pixel of the liquid crystal display apparatus.

The liquid crystal display apparatus disclosed in FIGS. 19 and 20 is operated via a dot reversion driving method.

Referring to FIG. 19, an array substrate 905 includes first and second gate lines GLn-1 and GLn, a data line DL, first, second and third thin film transistors T1 and T2 and T3, a transmissive electrode 940, a reflective electrode 950 and a compensating wiring 928.

The first thin film transistor T1 includes a first gate electrode that is electrically connected to the first gate line GLn-1, a first source electrode that is electrically connected to a ground voltage GT, and a first drain electrode that is electrically connected to the transmissive electrode 140. A pixel region includes first and second regions A1 and A2. The transmissive electrode 940 is formed in the first region A1. A compensating wiring 928 is also formed in the first region A1. The compensating wiring 928 is insulated from the transmissive electrode 940, and the compensating wiring 928 faces the transmissive electrode 940 in the first region A1.

The second thin film transistor T2 includes a second gate electrode that is electrically connected to the second gate line GLn, a second source electrode that is electrically connected to the data line DL, and a second drain electrode that is electrically connected to the compensating wiring 928. The reflective electrode 940 is formed in the second region A2, such that the reflective electrode 950 is electrically insulated from the transmissive electrode 940. The compensating wiring 928 is also insulated from the reflective electrode 950, and the compensating wiring 928 faces the reflective electrode 950 in the second region A2.

The third thin film transistor T3 includes a third gate electrode that is electrically connected to the first gate line GLn-1, a third source electrode that is electrically connected to the data line DL, and a third drain electrode that is electrically connected to the compensating wiring 928.

Referring to FIG. 20, the first drain electrode of the first thin film transistor T1 is electrically connected to a first liquid crystal capacitor Clct and a first sub capacitor Cstt. The first liquid crystal capacitor Clct and the first sub capacitor Cstt are electrically connected in parallel to each other.

The second drain electrode of the second thin film transistor T2 is electrically connected to a second sub capacitor Cstr and a second compensating capacitor Ccpr. The second compensating capacitor Ccpr is electrically connected in series to a second liquid crystal capacitor Clcr. A composite capacitor of the second compensating capacitor Ccpr and the second liquid crystal capacitor Clcr is electrically connected in parallel to the second sub capacitor Cstr.

The first thin film transistor T1 is electrically connected to the second thin film transistor T2 via a first compensating capacitor Ccpt. That is, the first drain electrode of the first thin film transistor T1 is electrically connected to a first terminal of the first compensating capacitor Ccpt, and the second drain electrode of the second thin film transistor T2 is electrically connected to a second terminal of the first compensating capacitor Ccpt.

The second terminal of the first compensating capacitor Ccpt is also electrically connected to the third drain electrode of the third thin film transistor T3.

When a first gate voltage is applied to the first gate line GLn-1, the first gate voltage is transferred to the first gate electrode of the first thin film transistor T1, so that the first and third thin film transistors T1 and T3 are turned on. Then, the ground voltage that is applied to the first source electrode of the first thin film transistor T1 is outputted via the first drain electrode of the first thin film transistor T1, and the first data voltage Vd1 that is applied to the third source electrode of the third thin film transistor T3 is outputted via the third drain electrode of the third thin film transistor T3, wherein the first data voltage Vd1 is negative.

Then, the ground voltage is transferred to the first terminal of the first compensating capacitor Ccpt, and the first data voltage Vd1 is transferred to the second terminal of the first compensating capacitor Ccpt, so that the first compensating capacitor Ccpt is electrically charged.

When a second gate voltage is applied to the second gate line GLn, the second gate voltage is transferred to the second gate electrode of the second thin film transistor T2, so that the second thin film transistor T2 is turned on. The first gate voltage is applied to the first gate line GLn-1, until the second gate voltage is applied to the second gate line GLn. Thus, when the second thin film transistor T2 is turned on, the first thin film transistor T1 is turned off simultaneously. Therefore, the transmissive electrode 940 maintains a floating state.

When the second thin film transistor T2 is turned on, a second data voltage Vd2 that is applied to the second source electrode from the data line DL is transferred to the second drain electrode, wherein the second data voltage Vd2 is positive.

When the second thin film transistor T2 is turned on, the second data voltage Vd2 is applied to the second terminal of the first compensating capacitor Ccpt, and a transmissive voltage Vt that is higher than the second data voltage Vd2 is applied to the first terminal of the first compensating capacitor Ccpt.

The transmissive voltage Vt that is applied to the transmissive electrode 940 when the second thin film transistor T2 is turned on is expressed as the following Expression 4.

$$Vt = Vd2 + 1/(C2+C3) \times (-C3 \times Vd2 + C2 \times Vd1),$$   Expression 4

Wherein the C1, C2 and C3 are expressed in Expression 2.

As shown in Expression 4, the transmissive electrode Vt is higher than the second data voltage Vd2.

Embodiment 8

Figure 21:
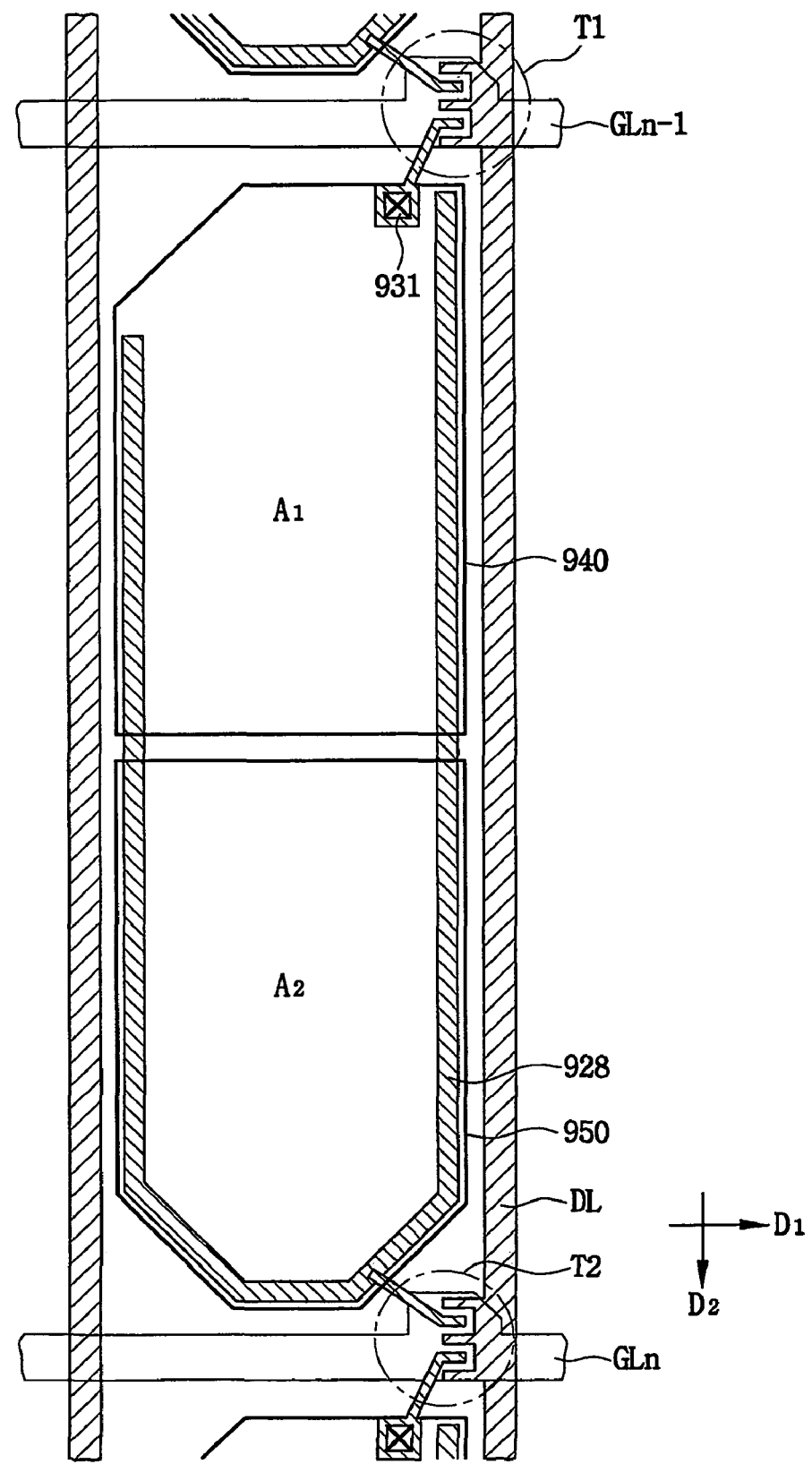
FIG. 21 is a layout showing an array substrate of a liquid crystal display apparatus according to an eighth exemplary embodiment of the present invention.
Figure 22:
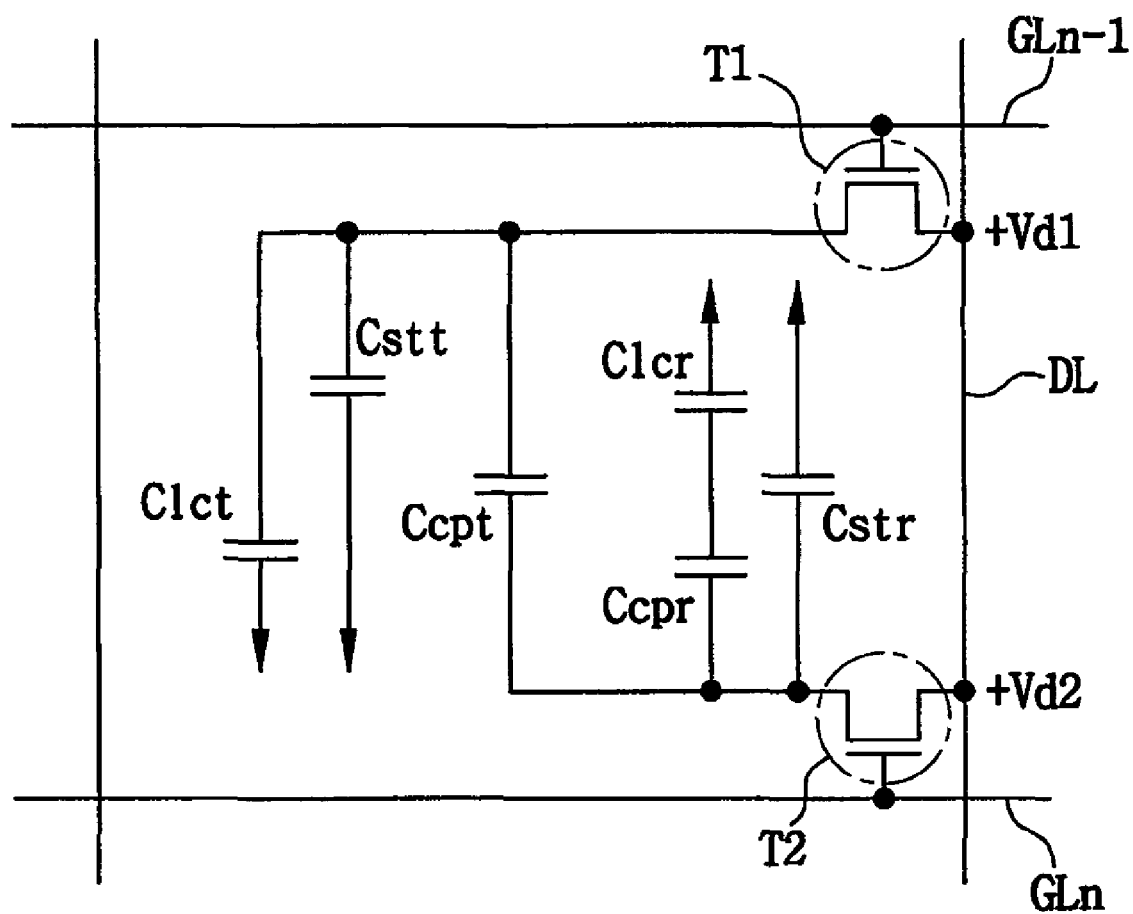
FIG. 22 is an equivalent circuit diagram showing a unit pixel of the liquid crystal display apparatus of FIG. 21.

FIG. 21 is a layout showing an array substrate of a liquid crystal display apparatus according to an eighth exemplary embodiment of the present invention. FIG. 22 is an equivalent circuit diagram showing a unit pixel of the liquid crystal display apparatus of FIG. 21, and FIG. 23 is a wave pattern of FIG. 22.

Figure 23:
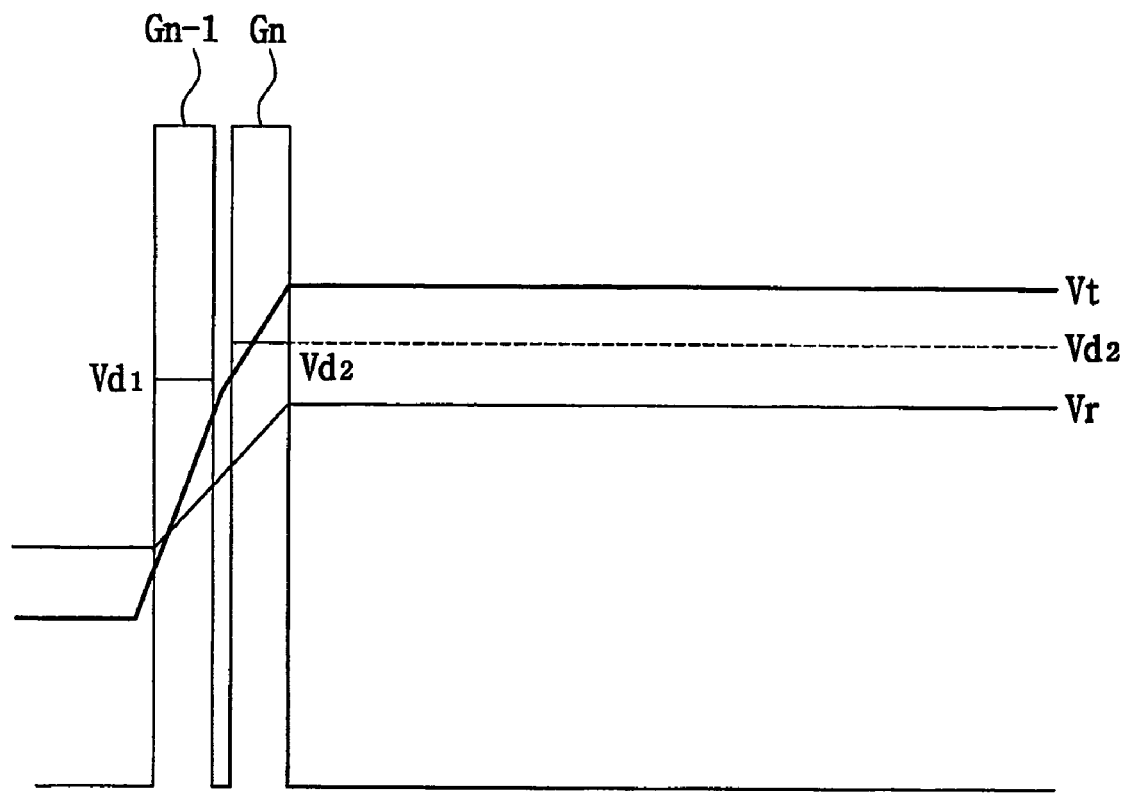
FIG. 23 is a wave pattern of FIG. 22.

The liquid crystal display apparatus disclosed in FIGS. 21 to 23 is operated via a column reversion driving method.

Referring to FIG. 21, an array substrate 907 of a liquid crystal display apparatus according to an eighth exemplary embodiment of the present invention, includes a first gate line GLn-1, a second gate line GLn, first and second thin film transistors T1 and T2, a transmissive electrode 940, a reflective electrode 950 and a compensating wiring 928.

The first thin film transistor T1 includes a first gate electrode that is electrically connected to the first gate line GLn-1, a first source electrode that is electrically connected to the data line DL, and a first drain electrode that is electrically connected to the transmissive electrode 140.

A pixel region includes first and second region A1 and A2. The transmissive electrode 940 is formed in the first region A1. The compensating wiring 928 faces the transmissive electrode 940 in the first region A1. The compensating wiring 928 is electrically insulated from the transmissive electrode 940.

The second thin film transistor T2 includes a second gate electrode that is electrically connected to the second gate line GLn, a second source electrode that is electrically connected to the data line DL, and a second drain electrode that is electrically connected to the compensating wiring 928.

The reflective electrode 950 is formed in the second region A2, such that the reflective electrode 950 is electrically insulated from the transmissive electrode 940. The compensating wiring also faces the reflective electrode 950 in the second region A2.

Referring to FIG. 22, a unit pixel includes first and second gate lines GLn-1 and GLn, and data line DL. The first thin film transistor T1 includes a first gate electrode that is electrically connected to the first gate line GLn-1, and a first source electrode that is electrically connected to the data line DL. The second thin film transistor T2 includes a second gate electrode that is electrically connected to the second gate line GLn, and a second source electrode that is electrically connected to the data line DL.

The first thin film transistor T1 further includes a first drain electrode that is electrically connected to a first liquid crystal capacitor Clct and the first sub capacitor Cstt. The first liquid crystal capacitor Clct and the first sub capacitor Cstt are electrically connected in parallel with each other.

The second thin film transistor T2 further includes a second drain electrode that is electrically connected to a second sub capacitor Cstr and a second compensating capacitor Ccpr. The second compensating capacitor Ccpr is electrically connected in series to a second liquid crystal capacitor Clcr. A composite capacitor of the second compensating capacitor Ccpr and the second liquid crystal capacitor Clcr is electrically connected in parallel to the second sub capacitor Cstr. A composition capacitor of the first liquid crystal capacitor Clct and the first sub capacitor Cstt is electrically connected to a first terminal of a first compensating capacitor Ccpt, and the second drain electrode of the second thin film transistor T2 is electrically connected to a second terminal of the second terminal of the first compensating capacitor Ccpt.

When a first gate voltage is applied to the first gate line GLn-1, the first gate voltage is transferred to the first gate electrode of the first thin film transistor T1, so that the first thin film transistor T1 is turned on. Thus, a first data voltage Vd1 that is applied to the first source electrode of the first thin film transistor T1 is transferred to the first drain electrode of the first thin film transistor T1. The first data voltage Vd1 corresponds to a transmissive voltage Vt that is applied to the transmissive electrode 940.

The second thin film transistor T2 is in a turned off state, so that the second drain electrode of the second thin film transistor T2 is maintained in lower voltage state than the first drain electrode of the first thin film transistor T1. That is, a voltage of the second drain electrode is negative.

Thus, a reflective voltage Vr (or second data voltage) that is applied to the reflective electrode 950 becomes lower than the transmissive voltage Vt (or first data voltage).

When a second gate voltage is applied to the second gate line GLn, the second gate voltage is transferred to the second gate electrode of the second thin film transistor T2, so that the second thin film transistor T2 is turned on.

The first gate voltage is applied to the first gate line GLn-1 until the second gate voltage is applied to the second gate line GLn, so that the second thin film transistor T2 is turned on, and the first thin film transistor T1 is turned off simultaneously. Thus, when the first thin film transistor T1 is turned off, the transmissive electrode 940 becomes a floating state.

When the second thin film transistor T2 is turned on, the second data voltage Vd2 that is applied to the second source electrode from the data line DL transferred to the second drain electrode.

The first and second data voltages Vd1 and Vd2 are positive, and the first data voltage Vd1 is lower than the second data voltage Vd2.

Both of the reflective voltage Vr and the transmissive voltage Vt are enhanced to be higher than the second data voltage Vd2 due to the second data voltage Vd2. The transmissive voltage Vt is higher than the reflective voltage Vr.

$$Vt=1/(C1+C2)\times[(2-C3/C2)\times(C1+C2)\times Vd2+(C1+C2)\times Vd1],$$ Expression 5

Wherein C1, C2 and C3 are expressed in Expression 2.

As shown in Expression 5, the transmissive voltage Vt is higher than the second data voltage Vd2.

INDUSTRIAL APPLICABILITY

According to the present invention, a first voltage is applied to the transmissive electrode that is formed in the first region of the pixel region, and a second voltage that is lower than the first voltage is applied to the reflective electrode that is formed in the second region of the pixel region.

Thus, both of a reflectivity of the reflective electrode and a transmissivity of the transmissive electrode are enhanced simultaneously while the liquid crystal display apparatus maintains a uniform cell gap.

Further, an additional process is not required, so that productivity is enhanced.

Although the exemplary embodiments of the present invention have been described it is understood that the present invention should not be limited to these exemplary embodiments, but various changes and modifications can be made by one ordinary skilled in the art within the spirit and scope of the present invention as hereinafter claimed.

The invention claimed is:

1. An array substrate comprising:
    a first gate line;
    a second gate line that is electrically insulated from the first gate line;
    a data line crossing the first and second gate lines to define a pixel region that includes first and second regions;
    a first switching device that is electrically connected to the first gate line and the data line;
    a second switching device that is electrically connected to the second gate line;
    a transmissive electrode that is electrically connected to the second switching device, the transmissive electrode being formed in the first region;
    a reflective electrode that is electrically insulated from the transmissive electrode, the reflective electrode being formed in the second region that is adjacent to the first region; and
    a compensating wiring that is electrically connected to the first switching device, the same compensating wiring facing the reflective electrode and the transmissive electrode with an insulation layer interposed between the compensating wiring and the reflective electrode and between the compensating wiring and the transmissive electrode.

2. The array substrate of claim 1, wherein the first switching device corresponds to a first thin film transistor including a gate electrode that is electrically connected to the second gate line, a source electrode that is electrically connected to the data line, and a drain electrode that is electrically connected to the compensating wiring.

3. The array substrate of claim 1, wherein the second switching device corresponds to a second thin film transistor including a gate electrode that is electrically connected to the first gate line, a source electrode that is electrically connected to a ground voltage, and a drain electrode that is electrically connected to the transmissive electrode.

4. The array substrate of claim 1, wherein the second switching device corresponds to the second thin film transistor including a gate electrode that is electrically connected to the first gate line, a source electrode that is electrically connected to the data line, and a drain electrode that is electrically connected to the transmissive electrode and the compensating wiring.

5. The array substrate of claim 1, further comprising a circuit for allowing the first gate line to maintain a first driving signal until the second gate line receives a second driving signal.

6. The array substrate of claim 1, wherein the compensating wiring and the data line are formed from a same layer.

7. The array substrate of claim 3, further comprising a third thin film transistor that includes a gate electrode that is electrically connected to the first gate line, a source electrode that is electrically connected to the data line, and a drain electrode that is electrically connected to the compensating wiring.

* * * * *